US006034983A

United States Patent [19]

Fujii et al.

[11] Patent Number: 6,034,983

[45] Date of Patent: Mar. 7, 2000

[54] METHOD OF FABRICATING COMPOUND SEMICONDUCTOR DEVICE AND OPTICAL SEMICONDUCTOR DEVICE

[75] Inventors: Takuya Fujii; Mitsuru Ekawa; Tsuyoshi Yamamoto; Hirohiko Kobayashi, all of Kawasaki, Japan

[73] Assignee: Fujitsu Limited, Kawasaki, Japan

[21] Appl. No.: 09/069,197

[22] Filed: Apr. 29, 1998

Related U.S. Application Data

[62] Division of application No. 08/577,399, Dec. 22, 1995, Pat. No. 5,937,273.

[30] Foreign Application Priority Data

| | | | |
|---|---|---|---|
| Dec. 27, 1994 | [JP] | Japan | 6-324277 |
| Dec. 8, 1995 | [JP] | Japan | 7-320426 |
| Dec. 12, 1995 | [JP] | Japan | 7-322833 |

[51] Int. Cl.[7] ..... H01S 3/19; G02B 6/10; G02B 6/26

[52] U.S. Cl. ..... 372/50; 372/45; 385/43; 385/131

[58] Field of Search ..... 372/45, 46, 50, 372/96; 385/14, 43, 129–131; 257/17

[56] References Cited

U.S. PATENT DOCUMENTS

| | | | |
|---|---|---|---|
| 5,011,550 | 4/1991 | Konushi et al. | 148/33.5 |
| 5,079,184 | 1/1992 | Hatano et al. | 117/102 |
| 5,130,269 | 7/1992 | Kitahara et al. | 117/89 |
| 5,227,328 | 7/1993 | Khan et al. | 438/509 |
| 5,229,319 | 7/1993 | Kawakyu et al. | 117/102 |
| 5,266,127 | 11/1993 | Imaizumi et al. | 117/91 |
| 5,300,186 | 4/1994 | Kitahara et al. | 117/89 |
| 5,399,522 | 3/1995 | Ohori | 438/493 |
| 5,424,243 | 6/1995 | Takasaki | 438/493 |
| 5,574,289 | 11/1996 | Aoki et al. | 257/17 |
| 5,657,338 | 8/1997 | Kitamura | 372/50 |
| 5,787,106 | 7/1998 | Tabuchi et al. | 372/50 |
| 5,790,578 | 8/1998 | Takano | 372/45 |

FOREIGN PATENT DOCUMENTS

| | | |
|---|---|---|
| 0 661 783 | 7/1995 | European Pat. Off. . |
| WO 93 22793 | 11/1993 | WIPO . |

OTHER PUBLICATIONS

G, Coudenys et al: "Selective and shadow masked MOVPE growth of InP/InGaAs(P) heterostructures and quantum wells" *Journal of Crystal Growth,* vol. 124, No. 1/04, Nov. 1, 1992, pp. 497–501.

T. Fujii et al: "Origin of compositional modulation of InGaAs in selective area metalorganic vapor phase epitaxy" *Journal of Applied Physics,* vol. 78, No. 9, Nov. 1, 1995, pp. 5373–5386.

H. Kobayashi et al: "Tapered Thickness MQW Waveguide BH MQW Lasers" *IEEE Photonics Technology Letters,* vol. 6, No. 9, Sep. 1994, pp. 1080/1081.

H. Tabuchi et al., "Optical Coupling Characteristics of the Semiconductor Laser with a Spot Size Converter," Institute of Electronic Information Communication in Japan, National Autumn Meeting, 1993, Lecture No. C–182, and translation, (No Month Available).

*Primary Examiner*—Rodney Bovernick
*Assistant Examiner*—Quyen P. Leung
*Attorney, Agent, or Firm*—Armstrong, Westerman, Hattori, McLeland and Naughton

[57] ABSTRACT

A fabricating method of compound semiconductor device is proposed which has a step of varying selective growth ratio of crystal by changing either a mean free path of material gas in gas atmosphere for use in crystal growth or a thickness of a stagnant layer of the material gas, using selective growth mask having opening portion consisting of first region having a narrow width and second region having a wide width.

7 Claims, 22 Drawing Sheets

METHOD OF FABRICATING COMPOUND SEMICONDUCTOR DEVICE AND OPTICAL SEMICONDUCTOR DEVICE

This application is a division of prior application Ser. No. 08/577,399 filed Dec. 22, 1995, now U.S. Pat. No. 5,937,273.

BACKGROUND OF THE INVENTION

1. Field of the Invention

The present invention relates to a method of fabricating a compound semiconductor device and an optical semiconductor device and, more particularly, a method of fabricating a compound semiconductor device including steps of selectively growing compound semiconductor layers in predetermined regions on a growth substrate via masks by chemical vapor deposition such as metal organic vapor phase epitaxy (MOVPE).

2. Description of the Related Art

In recent years, an optical fiber has reached the stage that, because of the progress of optical communication technology and the increase in process information, it is planned to build the optical fiber in respective homes.

If the optical fibers are built in branch line systems for respective homes, it is requested that semiconductor lasers must be used at a considerably low cost in contrast to semiconductor lasers used in the trunk line systems.

Conventionally, since optical couplings between the semiconductor lasers and the optical fibers cost enormously, the fabricating methods of semiconductor integrated circuit device, by which the waveguide for converting a spot shape of a laser beam emitted from the semiconductor laser can be formed by a single crystal growth process, have been developed.

In the past, such phenomenon has been known that, when crystals are grown on the substrate having selective growth masks thereon by chemical vapor deposition such as metal organic vapor phase epitaxy, a crystal growth rate in an area near the selective growth mask is increased in comparison with the crystal growth rate in an area far from the selective growth mask.

A crystal growth having different growth rates in a plurality of areas respectively using such selective growth masks is referred to as "selective growth" hereinafter. A compound semiconductor optical device employing the selective growth is set forth in, for the first example, Tabuchi et al., "Optical Coupling Characteristics of the Semiconductor Laser with a Spot Size Converter", The Institute of Electronic Information Communication in Japan, National Autumn Meeting, 1993, Lecture Number C-182 and, for the second example, Kobayashi et al., [IEEE photon. Tech Lett., Vol. 6, pp. 1080–1081, 1994.

A compound semiconductor light emitting device with a beam conversion waveguide in which compound semiconductor light emitting devices and compound semiconductor waveguides are monolithically integrated by use of such phenomenon can be fabricated.

As set forth above, if a film thickness of a crystal layer which is selectively grown by using the selective growth mask can be controlled, the margin of device design can be enlarged in case different semiconductor devices must be formed simultaneously on the same substrate.

Next, taking as an example the case a compound semiconductor light emitting device with a beam conversion waveguide in which a compound semiconductor light emitting device and a compound semiconductor waveguide are integrated is manufactured, conventional selective growth method using the selective growth mask will be explained.

FIG. 1 is a plan view showing a substrate and selective growth masks in case a selective growth method is performed by the metal organic chemical vapor deposition. The inventors of the present invention have tried to perform the selective growth of crystal on a substrate on which selective growth masks are arranged, as shown in FIG. 1.

In FIG. 1, a reference 11 denotes a growth substrate. References rectangular $M_{11}$, $M_{12}$, $M_{13}$, $M_{14}$, $M_{21}$, $M_{22}$, $M_{23}$ and $M_{24}$ denote respectively a selective growth mask formed on the substrate. A reference 13 denotes a narrow region between the selective growth masks, which is called as a stripe portion. A reference 14 denotes a wide region between the selective growth masks, which is called as an opening portion.

In the selective growth method by means of the metal organic chemical vapor deposition using the selective masks, for example, the selective growth masks $M_{11}$, $M_{12}$, $M_{13}$, $M_{14}$, each having a length L of 600 $\mu$m and a width W of 240–280 $\mu$m and formed of a dielectric film such as $SiO_2$ are aligned at a distance $W_1$ of 10–60 $\mu$m in the longitudinal direction (y direction) on the substrate 11 formed of InP etc. Similarly, the selective growth masks $M_{21}$, $M_{22}$, $M_{23}$ and $M_{24}$ are aligned at a distance $L_1$ of 1200 $\mu$m from the selective growth masks $M_{11}$, $M_{12}$, $M_{13}$, $M_{14}$ in the lateral direction (x direction) on the substrate 11.

Then, under uniform growth conditions, InP crystal layer is grown by the metal organic chemical vapor deposition on an entire surface of the growth substrate 11 on which the selective growth masks $M_{11}$, $M_{12}$, $M_{13}$, $M_{14}$, $M_{21}$, $M_{22}$, $M_{23}$, $M_{24}$ are formed as above. Thereby, for instance, there is provided a film thickness distribution having thickness differences along an x line (imaginary line) which extends from an intermediate portion of the stripe portion 13 to an intermediate portion of the other stripe portion 13 via the opening portion 14.

FIG. 2 shows a relation between a growth rate and a distance from the center portion O of the selective growth masks when pressure in the growth atmosphere is set to be 100 Torr.

FIG. 2 shows the growth rate in the longitudinal direction (x direction) of the stripe portion 13 when the InP crystal layer is grown on a (001) face of the InP substrate at a pressure of 100 Torr in the growth atmosphere, on the assumption that the width W and the length L of the selective growth masks $M_{12}$, $M_{13}$, $M_{22}$, $M_{23}$ are formed as 240 $\mu$m and 600 $\mu$m, respectively, that the width of the stripe portion 13 is formed as 60 $\mu$m, and that the width of the opening portion 14 is formed as 1200 $\mu$m.

In FIG. 2, the ordinate indicates normalized growth rate based on the growth rate of the InP crystal layer which is grown on the opening portion 14 surrounded by the selective growth masks $M_{12}$, $M_{13}$, $M_{22}$, $M_{23}$ while the abscissa indicates position from an origin O which is a center point of the stripe portion 13. In FIG. 2, a broken line on the position 300 $\mu$m shows the edge of the selective growth masks $M_{12}$, $M_{13}$.

The film thickness distribution in FIG. 2 shows the result derived when the selective growth masks formed of $SiO_2$ are formed on the (001) face orientation of the InP substrate and the InP crystal layer is formed thereon. More, substantially identical effect can be derived even when other crystal layer, for example, InGaAs crystal layer, is grown.

Like this, an active layer of the semiconductor laser can be formed by the crystal layer of the thick compound semiconductor grown in the stripe portion 13. Also, a waveguide portion of the semiconductor laser, which converts a spot shape of light beam emitted from the semiconductor laser, can be formed by the crystal layer of the thin compound semiconductor grown in the opening portion 14.

Consequently, if the active layer of the semiconductor laser consists of the quantum well, the well layer serving as the active layer is thick and the well layer becomes gradually thin in the waveguide region. As a result, laser light generated at the active layer spreads its optical beam shape gradually in the waveguide portion without absorption loss because an optical confinement effect is gradually reduced, and then is emitted from the cleavage face on the edge of the waveguide portion as the light which has small beam size and small beam spreading angle.

In order to improve beam spot shape conversion characteristic in the waveguide portion, it is important that a ratio of crystal growth rate of the stripe portion 13 to crystal growth rate of the opening portion 14, i.e., a selective growth ratio must be determined large.

As described above, an optical semiconductor device like the semiconductor laser in which the compound semiconductor light emitting device and the compound semiconductor waveguide are monolithically integrated can be fabricated according to the selective growth method employing the conventional selective growth masks.

However, in the prior art, it has not been reported or disclosed that distribution of growth rate in respective layers constituting the compound semiconductor light emitting device and the compound semiconductor waveguide should be freely changed in every region of plural regions by desired amount. Therefore, for example, if the selective growth ratio of the crystal in the light emitting portion is intended to be increased by narrowing the width of the stripe portion 13, the selective growth ratio of the cladding layer on the active layer is also increased correspondingly.

For instance, in general the thickness of about 1 $\mu$m is required for the cladding layer in the waveguide portion. If the selective growth ratio required for the well layer is decided as "5" to effect beam conversion and the cladding layer is formed to have a thickness of 1 $\mu$m in the waveguide portion under the same condition, the cladding layer of the semiconductor laser has been grown to have the thickness of 5 $\mu$m.

This causes resistance of the device to increase since the film thickness has been grown in excess of required thickness as the cladding layer in the semiconductor laser. In this case, unevenness such as about 5 $\mu$m is caused on the surface of the cladding layer, which makes the process difficult after crystal growth.

As the simplest countermeasure to overcome the above drawback, there is a method where the active layer of the semiconductor laser is formed by the first crystal growth, then the selective growth masks are removed, and then the cladding layer having a uniform thickness is grown on an entire surface by the second crystal growth. However, in this case, the crystal growth which must be conducted essentially only at a time is required two times, thus decreasing yield in manufacturing.

As discussed above, the technology which permits the selective growth ratio to be controlled during growing the crystal is desired. Such desire is not limited to the compound semiconductor light emitting device with the beam conversion waveguide. The desire is common to the case where different semiconductor devices should be formed simultaneously on the same compound semiconductor crystal.

SUMMARY OF THE INVENTION

An object of the present invention is to provide a fabricating method of compound semiconductor including a step of achieving desired film thickness or desired composition distribution by controlling selective growth ratio in the course of growing if compound semiconductors are selectively grown by using masks.

According to an aspect of the present invention, in the fabricating method of the compound semiconductor device where selective growth masks are formed on part of the surface of the growth substrate, compound semiconductor layer is grown by the chemical vapor deposition in areas not covered by the selective growth masks, then different semiconductor devices are formed simultaneously on a surface of a single substrate to have different growth rates or different compositions respectively in near regions from the selective growth masks and far regions from the selective growth masks, a step of varying a ratio of a thickness of a stagnant layer of material seed generated on the substrate to a mean free path of material seed in vapor phase according to the compound semiconductor layer to be selectively grown is provided.

In this case, as a means for varying a ratio of the thickness of the stagnant layer of material seed to the mean free path of material seed, there is provided a method where growth pressure, seed of carrier gas, or a total amount of gas flow is adjusted according to the compound semiconductor layer to be selectively grown.

The thinner the thickness of the stagnant layer becomes, the smaller the selective growth ratio becomes. In addition, the selective growth ratio of the compound semiconductor layer becomes small as the mean free path is increased.

The thickness of the stagnant layer becomes thin in proportion to an increase of the total amount of gas flow. The mean free path is enlarged as the pressure in growth atmosphere is reduced.

It is preferable to set the pressure in growth atmosphere to 10 Torr or less in case the ratio ($t_1/t_2$) of the growth rate ($t_2$) of the compound semiconductor layer in near areas from the selective growth masks to the growth rate ($t_2$) of the compound semiconductor layer in far areas from the selective growth masks is decreased. On the other hand, it is also preferable to set the pressure in growth atmosphere to 50 Torr or more in case the ratio ($t_1/t_2$) of the growth rate is increased. The ratio ($t_1/t_2$) of the growth rate>1.

Planarization of the compound semiconductor layer can be achieved if the ratio of the growth rate becomes smaller while unevenness of the compound semiconductor layer is enhanced if the ratio of the growth rate becomes larger.

According to another aspect of the present invention, when the growth pressure is varied during growing the compound semiconductor layer into which the n type impurity or the p type impurity is introduced, the supply amount of gas including the n type impurity or the p type impurity is also varied simultaneously. This makes it possible that dose of the impurity in the compound semiconductor layer is adjusted by varying the growth pressure to be constant in the entire range.

It has been confirmed from the experiment by the inventors of the present invention that, if the growth pressure is increased during growing the compound semiconductor layer, dose of the n type impurity or the p type impurity may also be increased. On the contrary, if the growth pressure is decreased, dose may also be lessened.

It has also been verified from the experiment that, if a supply amount of the gas for introducing the n type impurity is kept constant, dose of the n type impurity in the compound semiconductor layer varies directly as square of the growth pressure in a certain range and varies directly as the growth pressure in another range.

Therefore, if the growth pressure at the boundary between these ranges is assumed as a third value $P_3$ and the n type impurity is doped, relations given by the following expressions may be concluded when the growth pressure is varied from $P_1$ to $P_2$. Where $A_1$ denotes a supply amount of the n type impurity containing gas under the growth pressure $P_1$, and $A_2$ denotes a supply amount of the n type impurity containing gas under the growth pressure $P_2$.

| | |
|---|---|
| $A_2/A_1 = (P_1/P_2)^2$ | (for $P_1 < P_2 \leqq P_3$) |
| $A_2/A_1 = (P_1/P_3)^2(P_3/P_2)$ | (for $P_1 \leqq P_3 \leqq P_2$) |
| $A_2/A_1 = P_1/P_2$ | (for $P_3 \leqq P_1 < P_2$) |

On the other hand, if the p type impurity is introduced, dose of the p type impurity in the compound semiconductor is in proportion to the one-half power of the growth pressure when a supply amount of the gas for introducing the p type impurity is held constant. If the growth pressure is varied from $P_2$ to $P_1$ upon doping the p type impurity, the following relation would be obtained. Where $B_2$ denotes a supply amount of the p type impurity containing gas under the growth pressure $P_2$ and $B_1$ denotes a supply amount of the p type impurity containing gas under the growth pressure $P_1$.

$$B_1/B_2=(P_2/P_1)^{1/2}$$

Depending upon the above relation, doses of the p type impurity and the n type impurity may be adjusted with good precision.

The change in dose in the compound semiconductor layer brings about the change in location of the pn junction generated by impurity diffusion, the change in the energy band structure, and the change in the resistance distribution, thus causing degradation in the characteristic of the compound semiconductor device.

Another object of the present invention is to provide a compound semiconductor device in which strain in a thick film thickness region can be adjusted.

According to still another aspect of the present invention, an amount of compressive strain generated in the gain regions of the optical guide layers can be reduced since tensile strain is generated in top portions of the waveguide regions of the optical guide layers for holding the quantum well structure layer therebetween. Since an overall amount of compressive strain can be reduced according to reduction in an amount of compressive strain in the optical guide layers, crystal dislocation becomes difficult to occur even if the number of the well layers in which compressive strain is being generated is increased.

Since increases of compressive strain in overall layers in the gain region may be suppressed because of such reduction of compressive strain, lattice relaxation in the overall device can be prevented from being generated even if compressive strain occurs in the well layer at the end of the waveguide region.

In addition, by causing the barrier layer surrounding the well layer to generate tensile strain at the end of the waveguide region, increase of compressive strain generated in the overall layers in the gain region can be further suppressed.

The advantage of reduction in an amount of compressive strain in the gain region by such stress adjustment in the optical guide layer may also arise from an optical semiconductor device having either a Fabry-Perot semiconductor laser or a DFB laser.

DESCRIPTION OF THE PREFERRED EMBODIMENTS

There will now be described preferred embodiments of the present invention hereinafter with reference to the accompanying drawings.

First Embodiment

Figure 3:
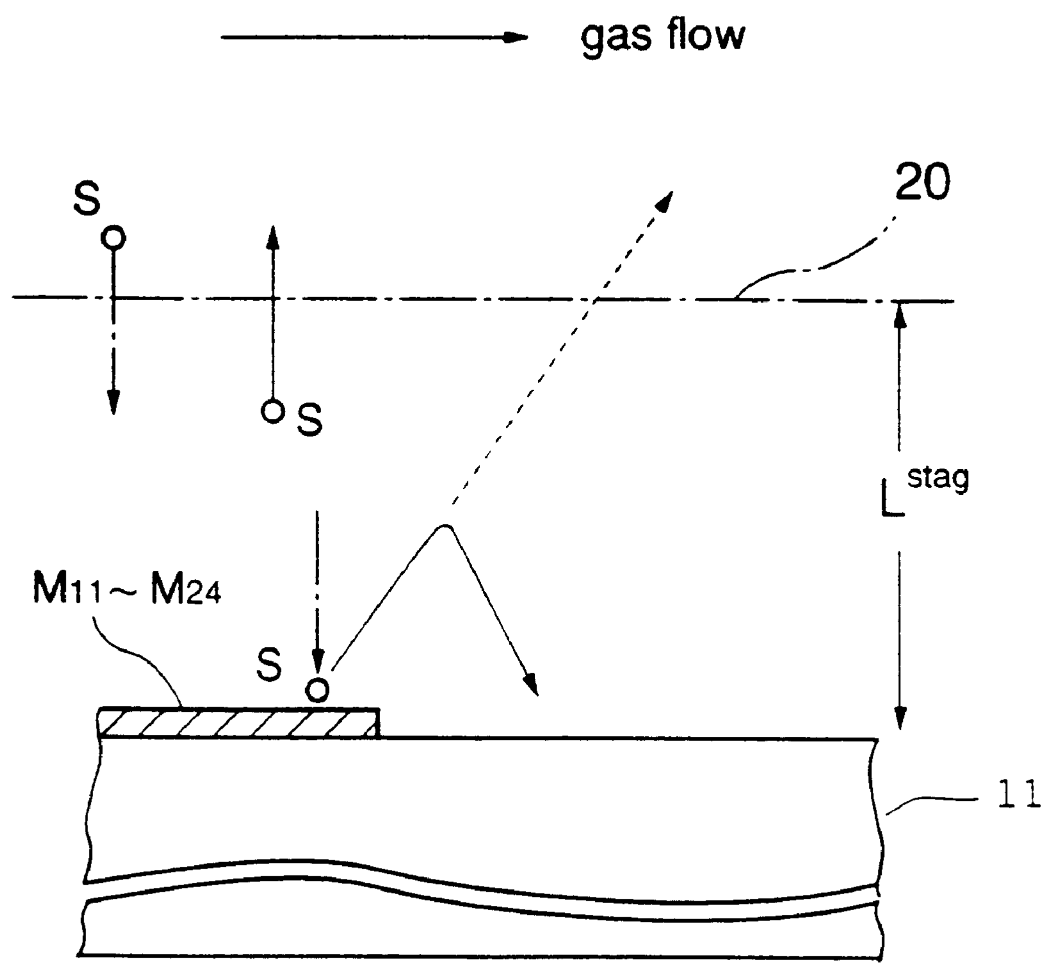
FIG. 3 is a schematic view showing a stagnant layer generated near a surface of the compound semiconductor substrate when the compound semiconductor are formed by selective growth on the compound semiconductor substrate.

When a compound semiconductor layer is grown on a surface of a compound semiconductor substrate by flowing material gas and carrier gas into low pressure atmosphere, a stagnant layer 20 of gas including material seed S is formed, as shown in FIG. 3, since flow rate of the gas is reduced if the gas flows close more and more to the surface of the compound semiconductor substrate. The material seed S denotes elements or their compound constituting the compound semiconductor. The thickness of the stagnant layer 20 is denoted by $L^S$ hereinafter.

In addition, materials seed S which is supplied to the surface of the selective growth masks $M_{11}$ to $M_{24}$ is not coupled with atoms on the surfaces, but returns again to the stagnant layer 20 to thus surface, but returns again to the stagnant layer 20 to thus be supplied to the surface of the compound semiconductor substrate.

Figure 1:
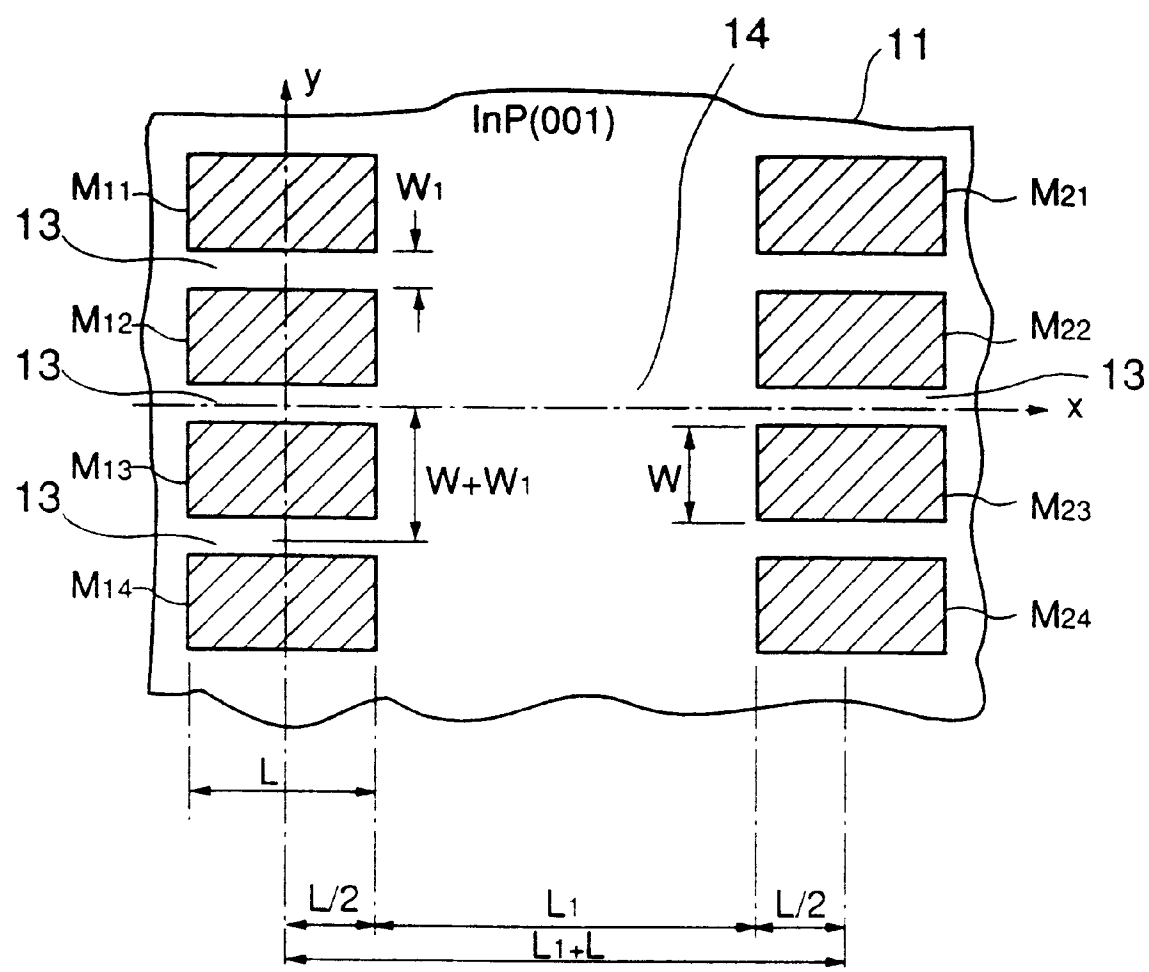
FIG. 1 is a plan view showing selective growth masks which are formed on a compound semiconductor substrate to be used when compound semiconductor layers are formed while changing their film thicknesses.
Figure 2:
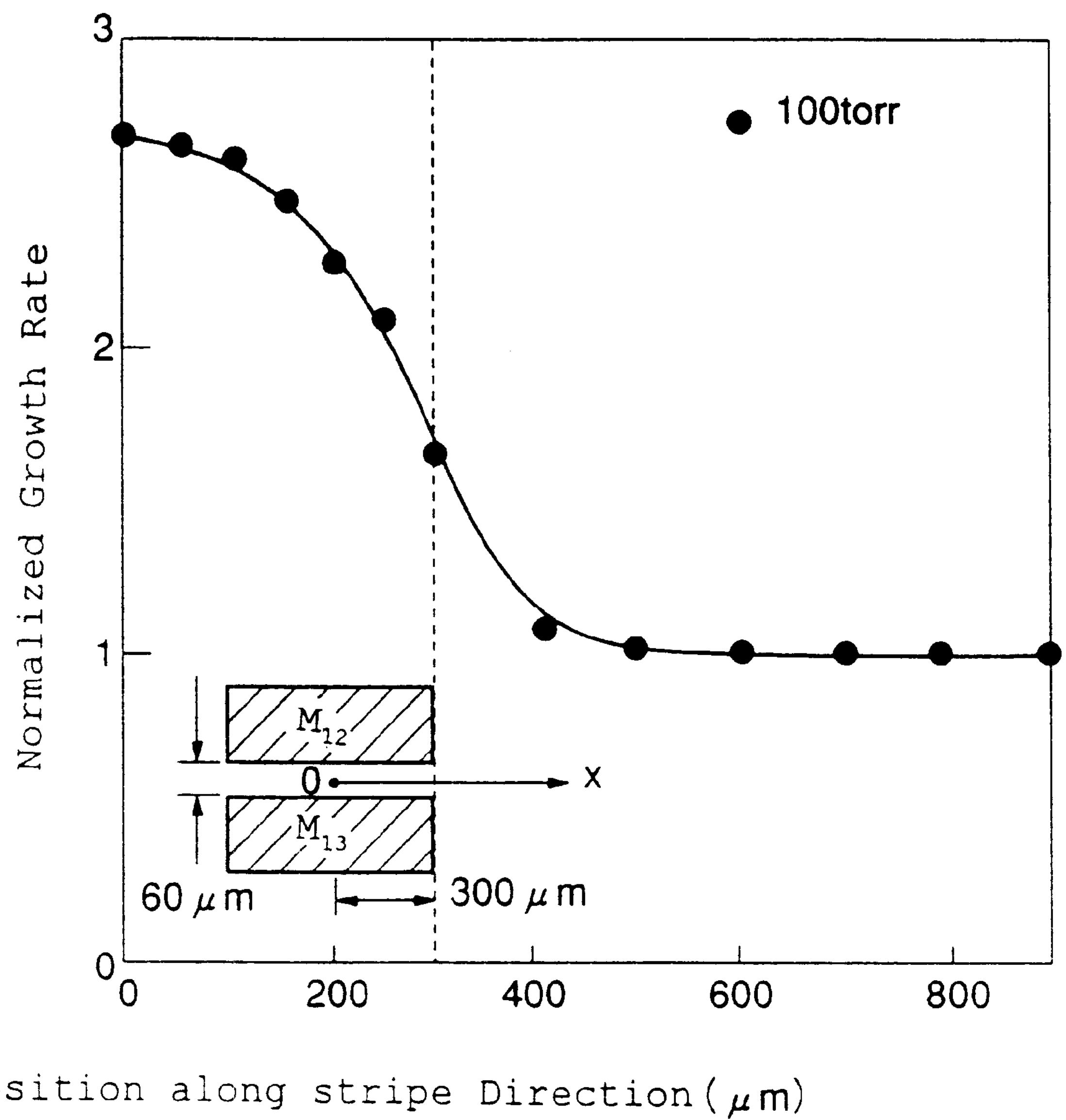
FIG. 2 is a characteristic view showing a relation between a growth rate and a position in the longitudinal direction of a stripe portion of the compound semiconductors formed on the compound semiconductor substrate using the selective growth masks shown in FIG. 1.

Then, if the material gas in the low pressure atmosphere has the larger mean free path, then the material seed supplied to the surface of the selective growth masks $M_{11}$ to $M_{24}$ in FIG. 1 may escape easier from the stagnant layer 20. Therefore, the material seed S which is supplied to the surface of the selective growth masks $M_{11}$, to $M_{24}$ becomes difficult to return the surface of the compound semiconductor substrate. As a result, the growth rate of the compound semiconductor in regions near the selective growth masks $M_{11}$ to $M_{24}$ is hard to increase.

Further, if the stagnant layer 20 becomes thinner, then the material seed S which is supplied to the surface of the selective growth masks $M_{11}$ to $M_{24}$ may also escape easier from the stagnant layer 20. Therefore, the growth rate of the compound semiconductor in regions near the selective growth masks $M_{11}$ to $M_{24}$ is also hard to increase.

Accordingly, in order to reduce unevenness of film thickness of the compound semiconductor using the selective growth masks $M_{11}$–$M_{24}$ shown in FIG. 1, either the mean free path may be increased or the thickness of the stagnant layer 20 may be thinned.

On the contrary, in order to enlarge thickness difference between the compound semiconductor in near regions from the selective growth masks $M_{11}$–$M_{24}$ and the compound semiconductor in far regions therefrom, either the mean free path may be decreased or the thickness of the stagnant layer 20 may be formed thick.

As shown in the following equation (1), the mean free path $L^f$ varies in inverse proportion to pressure P in low pressure atmosphere. Therefore, the smaller the pressure in low pressure atmosphere, the smaller the selective growth ratio of the compound semiconductor. The selective growth ratio denotes a ratio ($t_1/t_2$) of the thickness ($t_1$) of the compound semiconductor in near regions from the selective growth masks to the thickness ($t_2$) of the compound semiconductor in far regions from the selective growth masks.

$$L^f \; 1/P \qquad (1)$$

Figure 4:
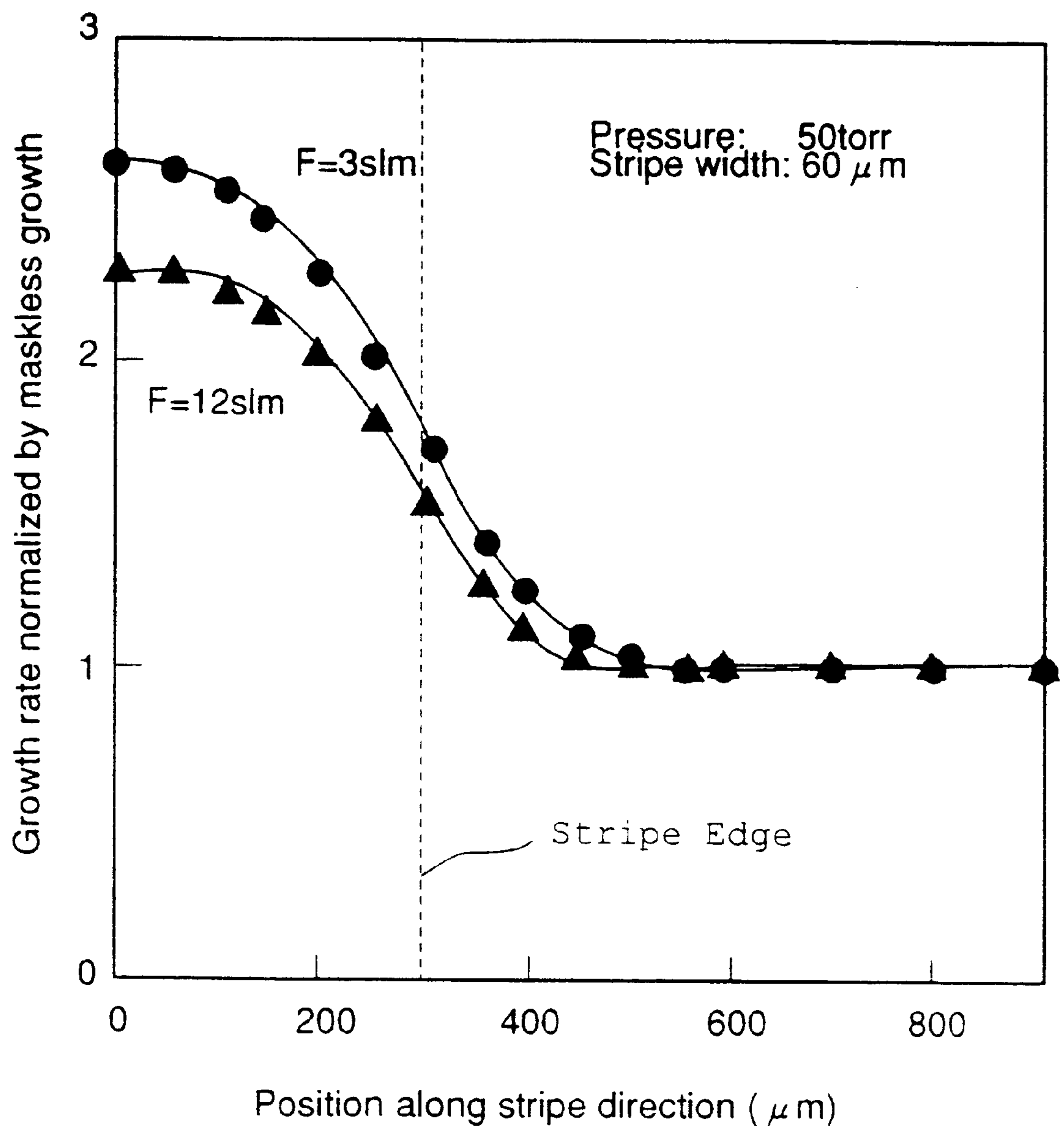
FIG. 4 is a characteristic view showing relations between crystal the growth rate and the position from the center of the stripe portion formed between the selective growth masks in the longitudinal direction of the stripe portion.

As apparent from the experimental result shown in FIG. 4, the thickness of the stagnant layer 20 depends upon the total amount of the gas flow.

FIG. 4 is a characteristic view illustrating relations between growth rates of the compound semiconductor and distances from the center of the stripe portion 13 shown in FIG. 1 in the x direction. FIG. 4 shows two characteristic curves when a total amount F of gas supplied to a reaction chamber is changed by adjusting a flow amount of the carrier gas. In this experiment, InP is grown as the compound semiconductor on the InP substrate under low pressure atmosphere of 50 Torr. The total amount F of gas introduced into the reaction chamber to grow InP is assumed as two ways, i.e., 3 slm and 12 slm.

In FIG. 4, the ordinate shows normalized growth rate based on crystal growth rate in case the crystal is grown without masks whereas the abscissa shows a distance measured from the center O of the stripe portion 13 having a width of 60 μm between the selective growth masks $M_{11}$–$M_{24}$.

From the experimental result, it can be understood that an increase in the growth rate in the stripe portion 13 due to the selective growth masks can be suppressed by increasing the total amount F of gas so that the selective growth ratio can be decreased. This is because the stagnant layer 20 becomes thin according to increase of the total amount of gas flow and the group III material seed supplied on the selective growth masks $M_{11}$–$M_{24}$ can easily go out from the stagnant layer 20.

Since it has been known that the thickness $L^s$ of the stagnant layer 20 is inversely proportional to reciprocal of square root of the total amount of gas flow, as shown in the following expression (2), the selective growth ratio cannot be changed significantly by solely adjusting the total amount of gas flow. But, the selective growth ratio can be varied significantly and with good precision by adjusting both the total amount of gas flow and growth pressure together.

$$L^S\ 1/\sqrt{F} \quad (2)$$

Figure 5:
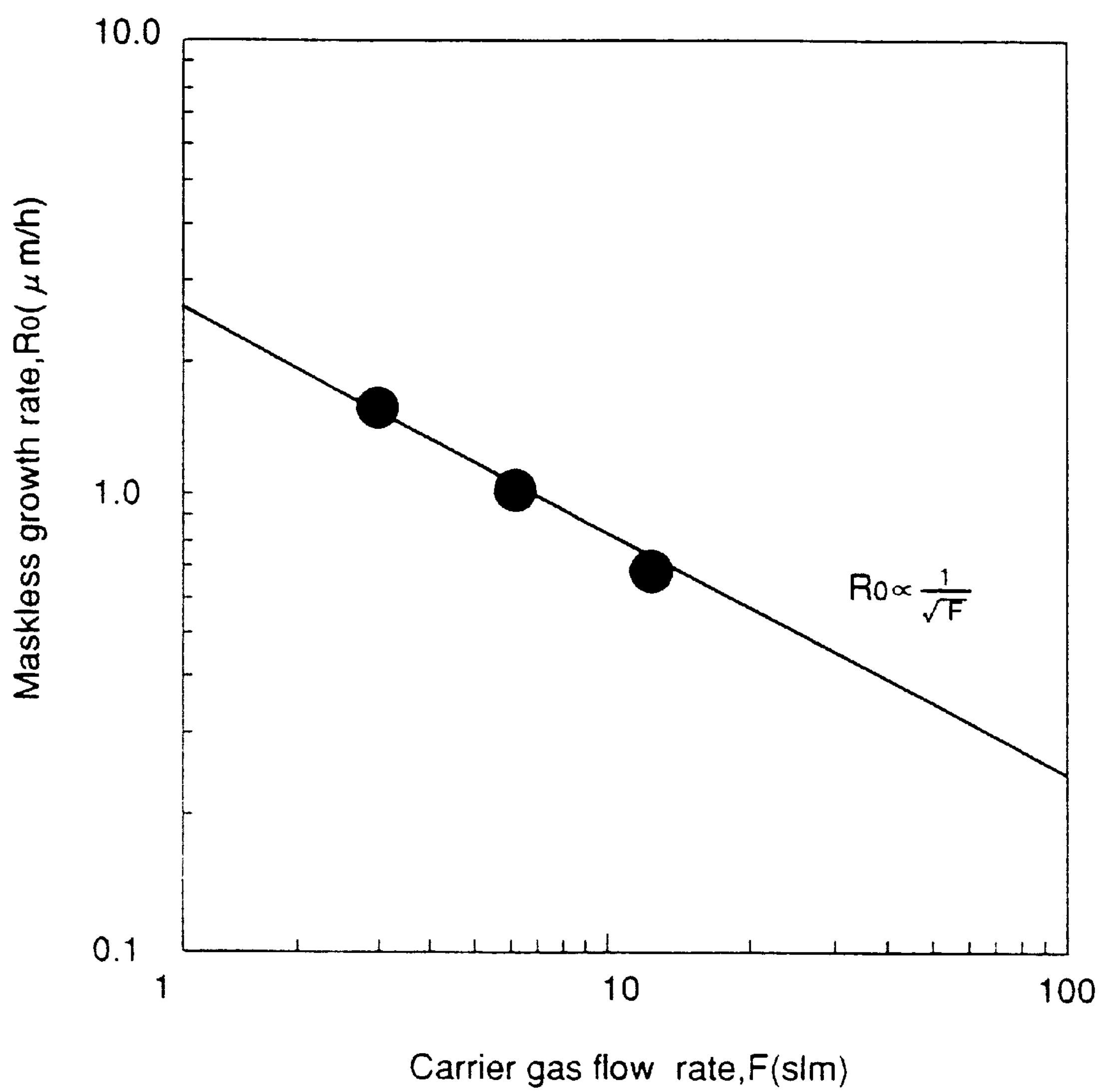
FIG. 5 is a characteristic view showing a relation between crystal grow rate and a flow amount of carrier gas when the selective mask is not used, wherein dots show measured values and the straight line indicates theoretical value.

The experimental result could be obtained as shown in FIG. 5 after the relation between the growth rate $R_0$ of the InP layer and the total amount F of gas has been investigated in case no mask is formed on the InP substrate. The crystal growth rate $R_0$ of this case is in proportion to reciprocal of a product of the thickness $L^S$ of the stagnant layer and the total amount F of gas flow, as shown in the following expression (3).

$$R_0\ 1/FL^S \quad (3)$$

The thickness $L^S$ of the stagnant layer is inversely proportional to reciprocal of square root of the total amount F of gas flow, as shown in the expression (2). As a result, a relation given by the following expression (4) can be derived.

$$R_0\ 1/\sqrt{F} \quad (4)$$

Thereby, the ordinate of FIG. 4 corresponds to the value obtained by multiplying actual growth rate by the square root of the total amount F of gas flow. According to FIGS. 4 and 5, it can be understood that the change of the crystal growth rate exists even in the far regions from the selective growth masks by varying the total amount of gas, but the significant change in growth rate like the crystal growth rate in the near regions from the selective growth masks does not occur.

As a factor for changing the mean free path, it can be considered that a kind of the carrier gas used for introducing the organic system gas is changed. Nitrogen and argon in addition to hydrogen can be used as the carrier gas. For example, nitrogen has shorter mean free path than that of hydrogen.

From the above experimental result, the selective growth ratio using the selective growth masks may be determined based on how much material seed is supplied to crystal growth region on the substrate by gas phase diffusion. The supplied amount depends upon a magnitude of the ratio ($L^f/L^S$) of the mean free path $L^f$ of material sees in gas phase to the thickness $L^S$ of the stagnant layer.

In other words, if the stagnant layer of material seed is thick and the mean free path of material seed in gas phase is short, there is few probability that material seed detached from the surface of the selective growth mask is sublimated to the outside of the stagnant layer since material seed collides many times with other material seeds or carrier gas seed (for example, hydrogen) during diffusing upwardly in the stagnant layer. As a result, material seed is supplied in large quantities on the crystal growth region near the selective growth masks.

On the contrary, if the stagnant layer of material seed is thin and the mean free path of material seed in gas phase is long, there are much probabilities that material seed detached from the surface of the selective growth mask is sublimated to the outside of the stagnant layer since material seed collides few times with other material seeds or carrier gas seed during diffusing upwardly in the stagnant layer. As a result, material seed is not supplied so much on the crystal growth region near the selective growth masks.

In other words, if the ratio of the mean free path of material sees in gas phase to the thickness of the stagnant layer can be controlled arbitrary during growing the crystal, the selective growth ratio may be controlled according to the function of constituting layers of plural semiconductor devices.

As apparent from the above, it can be appreciated that the methods of controlling the selective growth ratio are classified mainly into the method of controlling the thickness of the stagnant layer and the method of controlling the mean free path.

According to fluid mechanics, if the total amount of gas flow is increased, the stagnant layer can be made thin and the ratio of the thickness of the stagnant layer and material seed in gas phase can be reduced. On the contrary, as the method of controlling the mean free path, there is a method of controlling pressure in the growth chamber of the chemical vapor deposition apparatus while fixing the total amount of gas flow.

Since the mean free path is in proportion to reciprocal of the pressure in the chemical vapor deposition apparatus, the ratio $L^f/L^S$ of the thickness of the stagnant layer and the mean free path of material seed in gas phase is increased by lowering the pressure. If the ratio $L^f/L^S$ is increased, the selective growth ratio is reduced, thus uniformity of the film thickness of the compound semiconductor layer can be improved.

Inventors of the present invention have found the fact that the selective growth ratio in the crystal growth using the selective growth masks increases linearly according to an increase in the pressure in the chemical vapor deposition apparatus.

Figure 6:
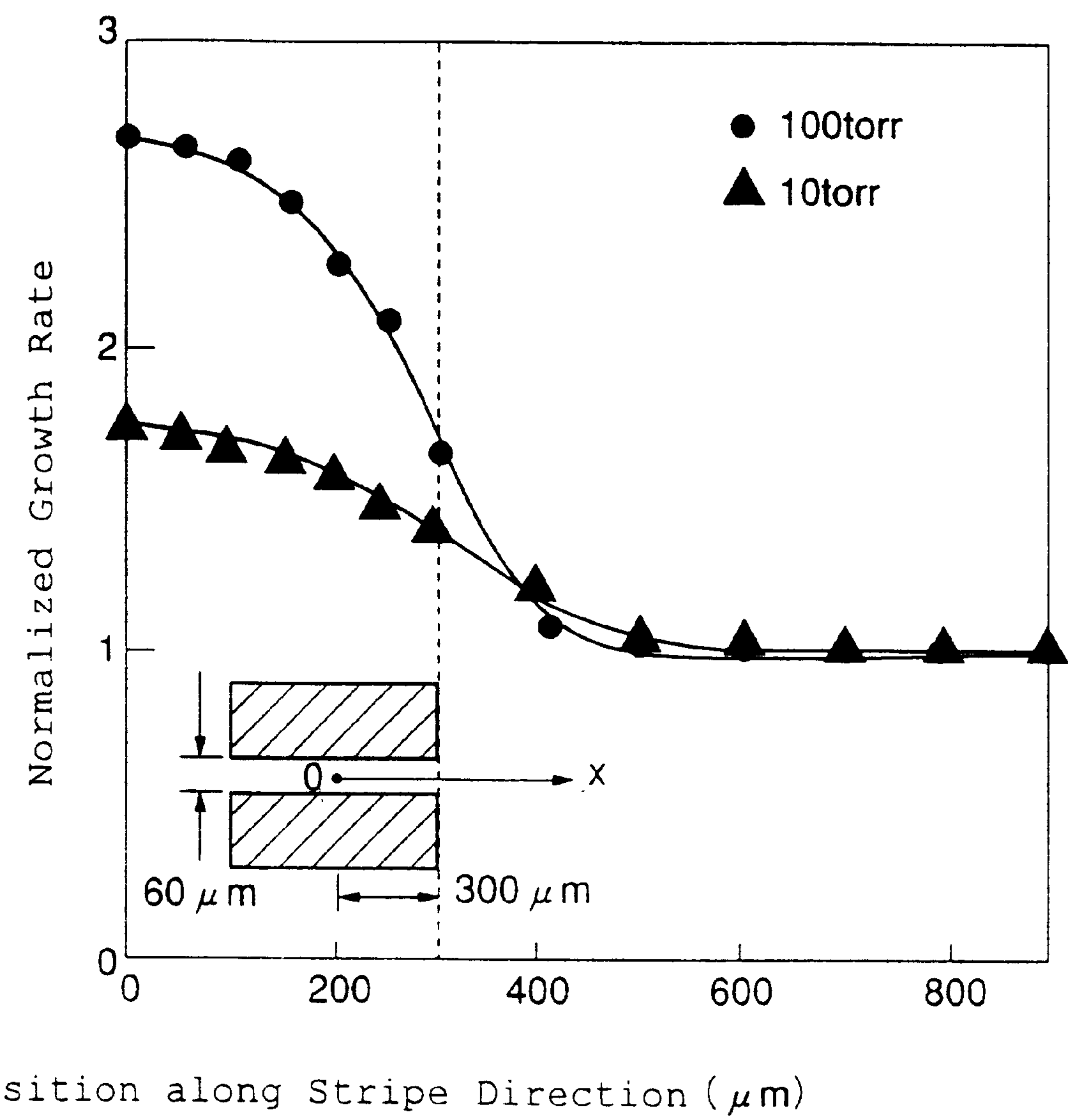
FIG. 6 is a characteristic view showing relations between the crystal growth rate and the position in the longitudinal direction of the stripe portions when the crystals are grown with changing a growth pressure in the growth atmosphere.

FIG. 6 shows a view illustrating relations between crystal growth rates and distances from the center O of the stripe portion of the selective growth masks in the longitudinal direction of the stripe portions in case the growth pressure in the growth atmosphere is changed.

FIG. 6 shows the growth rate in the longitudinal direction of the stripe portion 13 when the InP crystal layer is grown on a (001) face of the InP substrate at different pressure of 100 Torr and 10 Torr in the growth atmosphere, on the assumption that the width W and the length L of the selective growth masks $M_{12}$, $M_{13}$, $M_{22}$, $M_{23}$ are formed as 240 μm and 600 μm, respectively, that the width of the stripe portion 13 is formed as 60 μm, and that the distance between the selective growth masks $M_{12}$, $M_{13}$, $M_{22}$, $M_{23}$ in the longitudinal direction (width of the opening portion 14) is formed as 1200 μm.

It can be appreciated from FIG. 6 that the selective growth ratio given by the growth at 100 Torr is larger than that given by the growth at 10 Torr.

Figure 7:
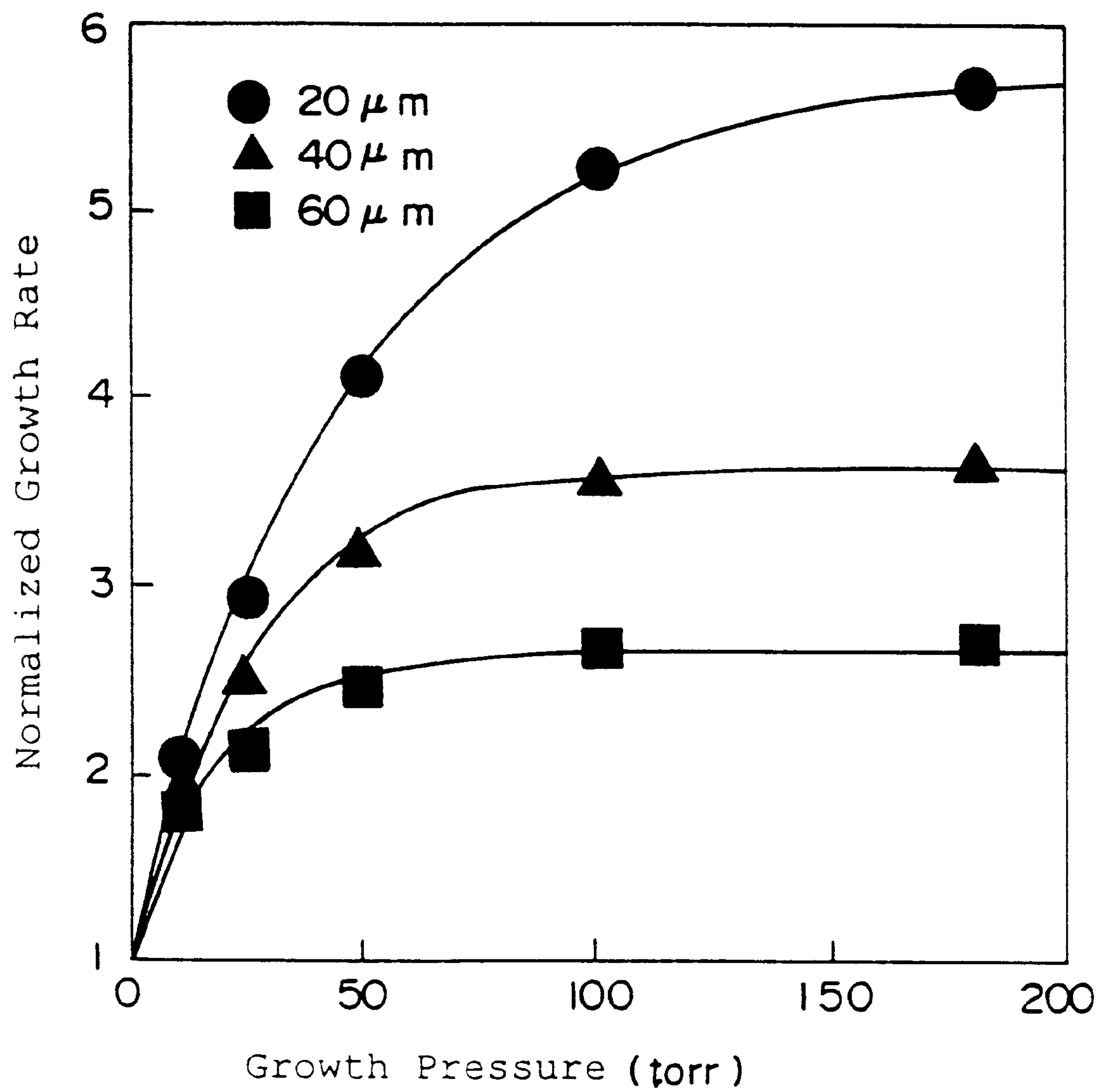
FIG. 7 is a characteristic view showing relations between the crystal growth rate and the growth pressure, which are derived from the experiments in which crystals are grown while changing the width of the stripe portion formed between the selective growth masks.

FIG. 7 shows relations between growth rates in the center of the stripe portion and growth pressure when widths of the stripe portions 13 in FIG. 1 are changed, i.e., the result of dependency of the selective growth ratio on the growth pressure.

Such tendency has been found from FIG. 7 that the selective growth ratio can be increased by narrowing the width of the stripe portion 13 while the selective growth ratio can be increased with an increase in the growth pressure regardless of the width of the stripe portion 13. If the width is 20 μm, the growth rate is saturated at about 200 Torr. The narrower the width becomes, the higher the saturated pressure becomes.

From the result shown in FIG. 7 and the results of other experiments, it has been appreciated that, if the growth pressure is less than or equal to about 3 Torr, the growth rate ratio due to difference in widths of the stripe portions 13 is lost so that the selective crystal ratio becomes 1.

In addition, it has been found that the selective growth ratio can be controlled arbitrary within a range from 1 to about 6 if the growth pressure is controlled by changing the width of the stripe portion 13.

Therefore, the layer having the large selective growth ratio may be formed by crystal growth at a pressure of 50 Torr or more whereas the layer having the small selective growth ratio may be formed by crystal growth at a pressure of about 10 Torr or less in low pressure.

The change of the growth pressure or the change of total amount of inlet gas flow is performed during growing the compound semiconductor layer or while growth of the compound semiconductor layer being ceased temporarily.

In case the compound semiconductor light emitting device having the beam diameter conversion waveguide in which the compound semiconductor light emitting device and the compound semiconductor waveguide are monolithically integrated is formed, if the crystal of an optical confinement portion of the active layer is grown at the growth pressure of about 200 Torr and the crystal of the cladding layer is grown at the growth pressure of about 10 Torr in low pressure, the film thickness of active layer can be varied by single crystal growth with not changing the film thickness of the cladding layer.

Incidentally, the stripe portion 13 aforementioned may be regarded as a narrow opening portion of the selective growth mask, and the opening portion 14 may be regarded as a wide opening portion of the selective growth mask.

Examples of the crystal growth will be explained in detail hereinafter.

First Example

Figure 8:
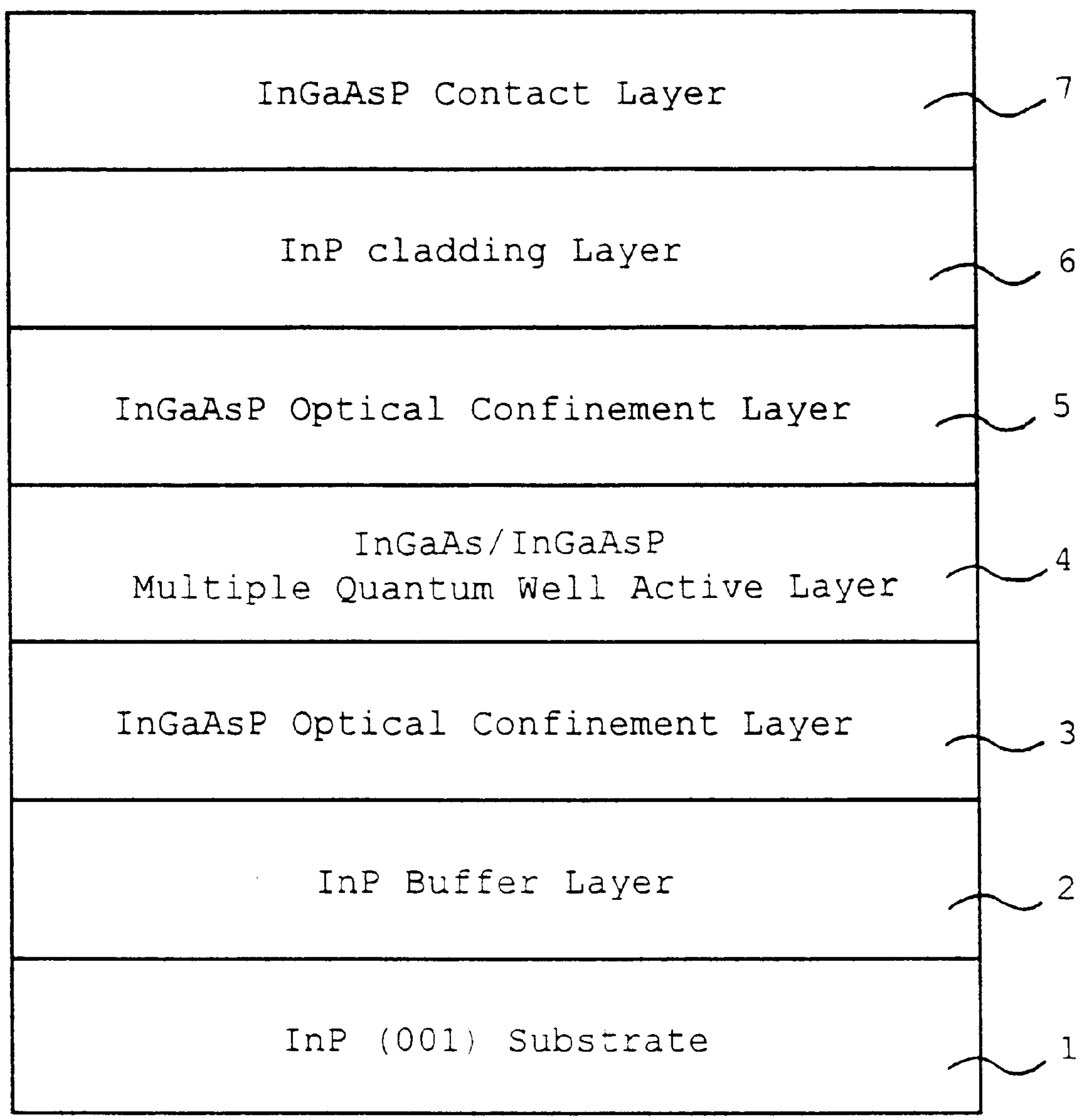
FIG. 8 is a schematic view showing a layer structure of compound semiconductor layers selectively grown on the compound semiconductor substrate.

FIG. 8 is a schematic sectional view showing a layer structure of a compound semiconductor light emitting device with a beam conversion waveguide which is fabricated by a first example of fabricating method.

In FIG. 8, reference 1 denotes an InP substrate; 2, an InP buffer layer formed on the InP substrate; 3, a first InGaAsP optical confinement layer formed on the buffer layer 2; 4, a multiple quantum well active layer consisting of an InGaAs quantum well layer and an InGaAsP barrier layer and formed on the optical confinement layer 3; 5, a second InGaAsP optical confinement layer formed on the multiple quantum well active layer 4; 6, an InP cladding layer formed on the second optical confinement layer 5; and 7, an InGaAsP contact layer formed on the cladding layer 6.

In this example, a case will be explained by way of example where a compound semiconductor light emitting device with a beam conversion circuit in which semiconductor lasers and semiconductor waveguides are monolithically integrated is fabricated according to the present invention.

Figure 9A:
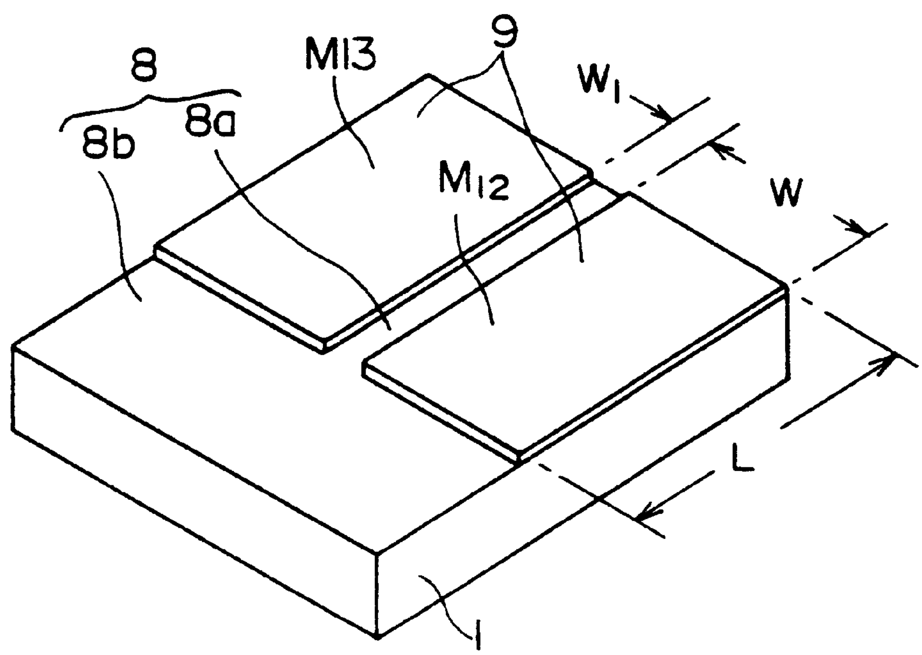
FIG. 9A is a perspective view showing a selective growth mask and the substrate used when a semiconductor laser and a semiconductor waveguide are monolithically formed.

First, as shown in FIG. 9A, an opening portion 8 consisting of a stripe region 8*a* and a sectorial region 8*b* is formed by forming an $SiO_2$ film on a (001) face of an InP substrate 1 and then patterning it. This resultant structure is used as a selective growth mask 9. Si3N4 etc. as well as $SiO_2$ may be used as material for the selective growth mask 9.

Figure 9B:
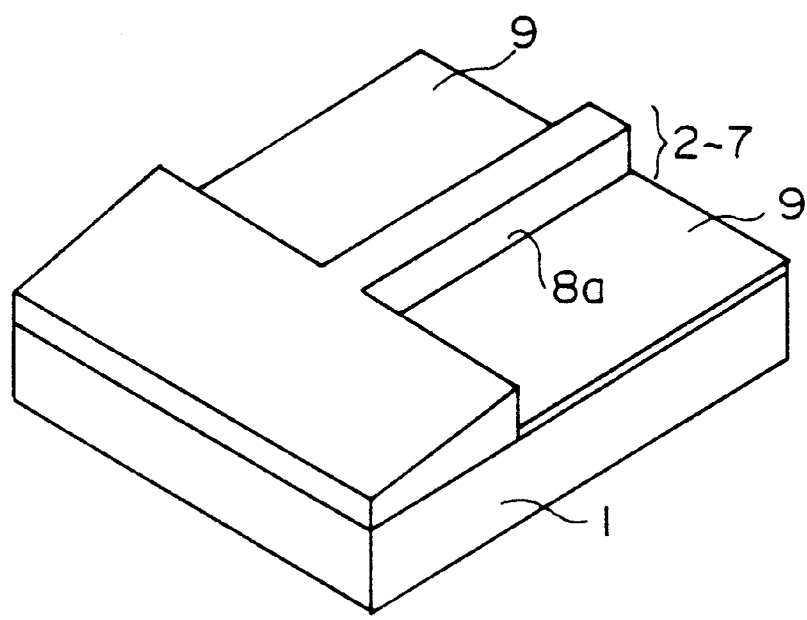
FIG. 9B is a perspective view showing a compound semiconductor layer formed on the substrate using the selective growth mask.

Then, as shown in FIG. 9B, the InP buffer layer 2 and the first InGaAsP optical confinement layer 3 are grown on the InP substrate 1 by metal organic vapor phase epitaxy (MOVPE). The multiple quantum well active layer 4 having an InGaAsP barrier layer and an InGaAs quantum well layer is grown thereon by MOVPE as well. In addition, the second InGaAsP optical confinement layer 5, the InP cladding layer 6 and the InGaAsP contact layer 7 are grown on the multiple quantum well active layer 4 by MOVPE.

In the semiconductor laser, for example, a thickness of the InP buffer 2 is 0.3 μm, a thickness of the InGaAsP optical confinement layer 3 is 0.1 μm, a thickness of the multiple quantum well active layer 4 is 0.05 μm, a thickness of the InGaAsP optical confinement layer 5 is 0.1 μm, a thickness of the InP cladding layer 6 is 2 μm, and a thickness of the InGaAsP contact layer 7 is 0.3 μm.

Further, if an n type substrate is used as the InP substrate 1, an n type impurity such as Si is doped into the InP buffer layer 2 and the first InGaAsP optical confinement layer 3 while a p type impurity such as Zn is doped into the second InGaAsP optical confinement layer 5, the InP cladding layer 6, and the InGaAsP contact layer 7.

Furthermore, trimethylindium may be used as material for In, trimethylgallium may be used as material for Ga, phosphine may be used as material for P, arsine may be used as material for As, silane may be used as material for Si, and methylzinc may be used as material for Zn. In order to introduce the organic system gases of the above gases, hydrogen gas may be used as the carrier gas.

In addition, as typical growth conditions, growth temperature is set at 620° C., growth rate is selected to 1 μm/hour, V/III ratio is set to be 100 at the time of growing the InP region, and V/III ratio is selected at 20 to grow InGaAs region. Where the V/III ratio means a mol ratio of the group V element to the group III element in the material gas.

The selective growth mask 9 is formed by growing an $SiO_2$ film of 50 nm in film thickness by chemical vapor deposition (CVD), and patterning the $SiO_2$ film by photolithography technique to have a shape shown in FIG. 9A. For example, a width of the stripe region 8*a* of the opening portion 8 is formed as 20 μm.

A surface state of the selective growth mask affect significantly selective growth. In particular, there is a possibility that organic material pits included in the resist used for photolithography technique remain. Therefore, it is preferable to grow crystals after a surface of the InP substrate is cleaned by $H_2SO_4$ solution, mixed solution of $H_2SO_4$+$H_2O_2$+$H_2O$, or the like.

Figure 10:
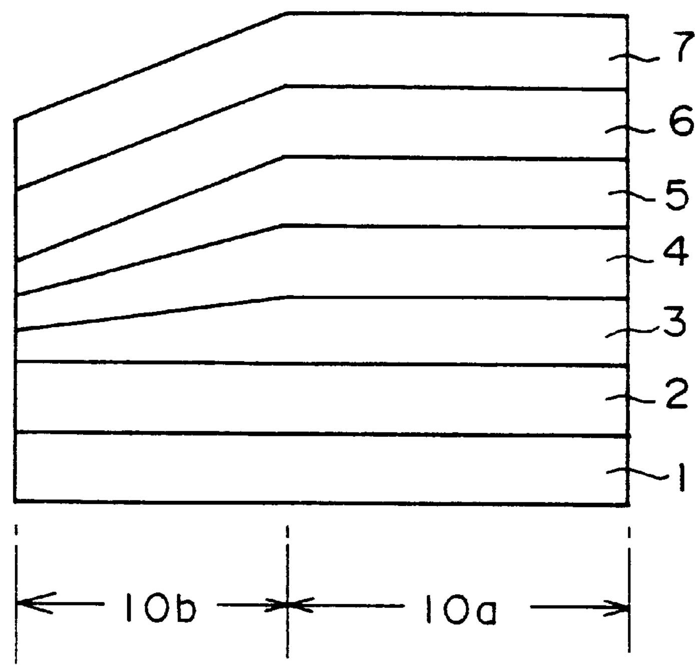
FIG. 10 is a sectional view showing a layer structure of the compound semiconductor layer shown in FIG. 9B.

To provide large selective growth ratio to only the InGaAsP optical confinement layer 3, the multiple quantum well active layer 4, and the InGaAsP optical confinement layer 5, crystals of the InP buffer layer 2, the InP cladding layer 6, and the InGaAsP contact layer 7 are grown in the atmosphere of 10 Torr while crystals of the first InGaAsP optical confinement layer 3, the multiple quantum well active layer 4, and the second InGaAsP optical confinement layer 5 are grown in the atmosphere of 180 Torr. Thus, a resultant layer structure obtained by the crystal growth is as shown in FIG. 10. Film thicknesses of the first InGaAsP optical confinement layer 3, the multiple quantum well active layer 4, and the second InGaAsP optical confinement layer 5 are thick in the semiconductor laser region 10*a,* and film thicknesses of them become gradually thin in the waveguide region 10*b*. The optical confinement layers 3, 5 and the multiple quantum well active layer 4 located in the waveguide region 10*b* are called as a core layer.

As apparent from the experimental result in FIG. 7, respective selective growth ratios of the InP buffer layer 2, the InP cladding layer 6, and the InGaAsP contact layer 7 become about "2" whereas respective selective growth ratios of the first InGaAsP optical confinement layer 3, the multiple quantum well active layer 4, and the second InGaAsP optical confinement layer 5 become about "6".

If the selective growth ratio is "6", the value is enough to satisfy the function of the waveguide structure. On the other hand, if the selective growth ratio is selected as "2" to grow the cladding layer, the value does not reduce performance of the semiconductor device, and not prevent the semiconductor device so much from being processed.

Figure 11:
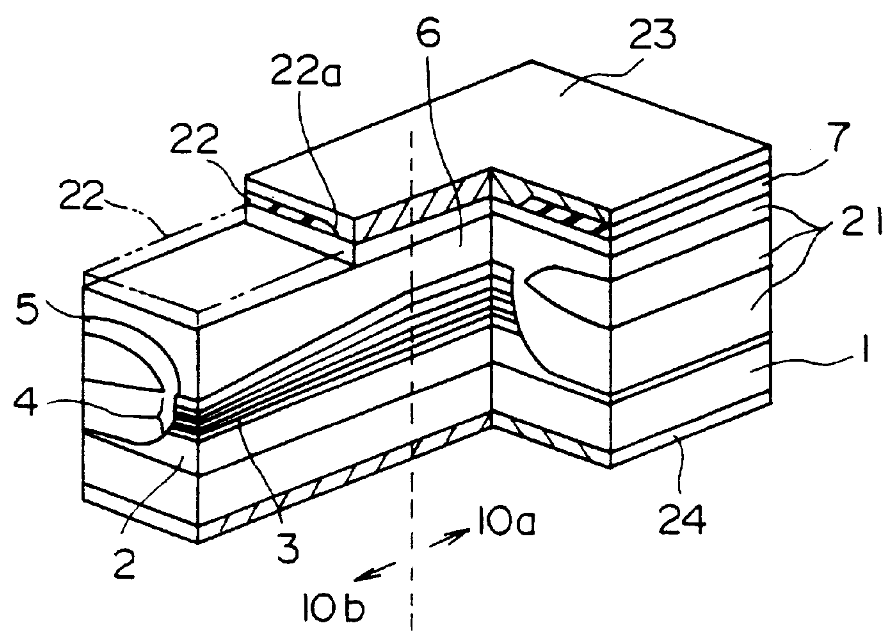
FIG. 11 is a perspective view, partially broken away and partially in section, showing an optical semiconductor device having compound semiconductor layers formed by the selective growth.

After the crystal growth, the selective growth mask 9 is removed by hydrogen fluoride. Then a gain region (laser region) and the waveguide region of the compound semiconductor light emitting device with the beam conversion waveguide, is covered with a stripe mask (not shown) having a width of several μm, and both ends of the semiconductor device are removed by etching. As a result, a stripe structure in a ridge type semiconductor laser with the beam conversion waveguide is finished, for example as shown in FIG. 11.

On both sides of the compound semiconductor stripe layer, an InP buried layer 21 having pnp junction and npn junction is formed. In addition, after the contact layer 7 near the optical output end in the waveguide region 10*b* being removed, the contact layer 7 in the gain region 10*a* and the contact layer 7 in the waveguide region 10*b* are covered with the insulating film 22.

An opening portion 22*a* is formed in the insulating film 22 over the compound semiconductor stripe layer. Then a first electrode 23 is connected to the contact layer 7 through the opening portion 22*a*. In addition, a second electrode 24 is connected to a lower surface of the InP substrate 1.

Second Example

As stated above, in the selective growth in the first example, one example has been explained. That is, the InP buffer layer 2, the InP cladding layer 6, and the InGaAsP contact layer 7 are selectively grown in the growth atmosphere of 10 Torr and at the selective growth ratio of about 2, while the first InGaAsP optical confinement layer 3, the multiple quantum well active layer 4, and the second InGaAsP optical confinement layer 5 are selectively grown in the atmosphere of 180 Torr and at the selective growth ratio of about 6, and thus optimal thicknesses of respective semiconductor layers of the compound semiconductor light emitting device and the compound semiconductor waveguide are formed.

In addition, the inventors of the present invention have found that, if the growth pressure is lowered with considering the experiment concerning the first example, unevenness of the surface of the compound semiconductor crystal formed by the selective growth is decreased to thus improve Planarization of the surface.

Figure 12:
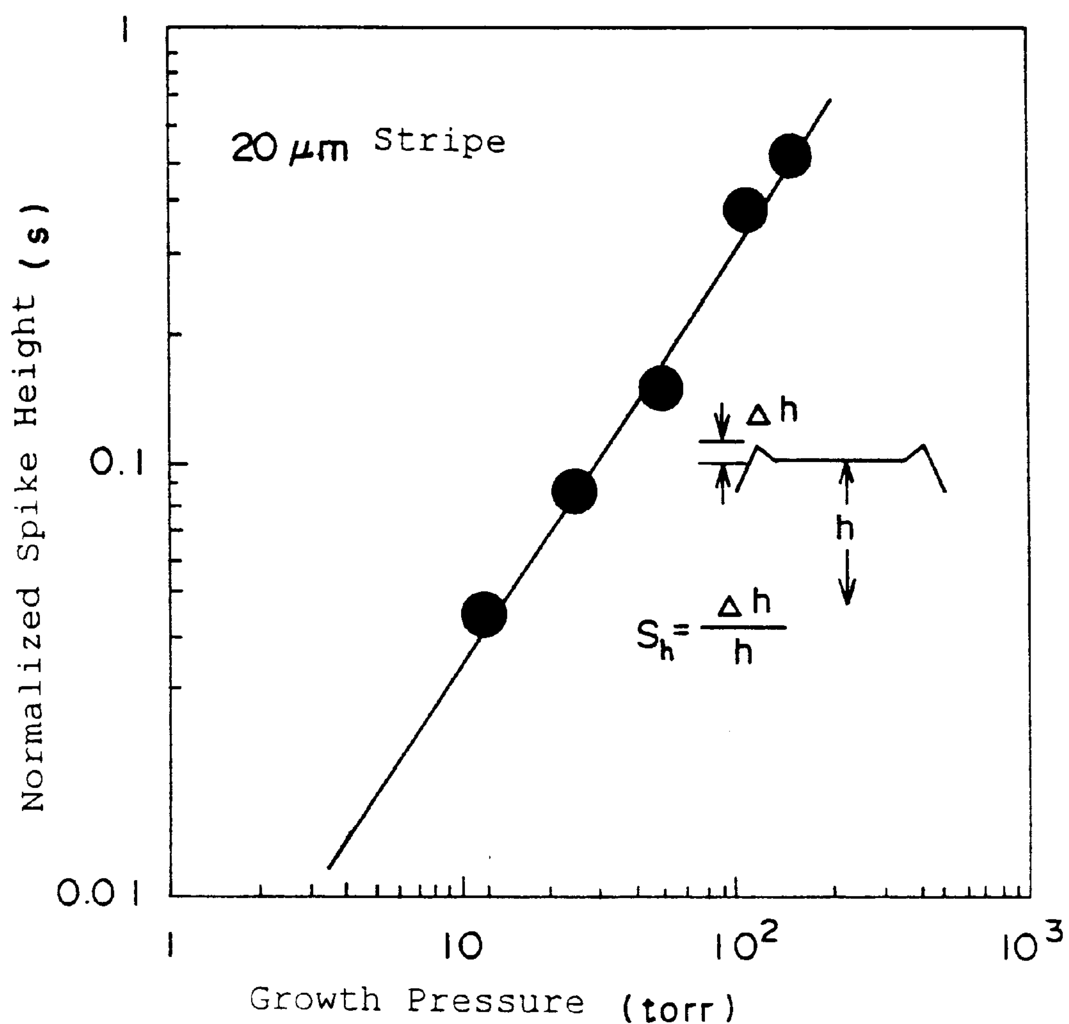
FIG. 12 is a characteristic view showing a relation between a spike height on an upper surface of the selectively grown compound semiconductor layers and the growth pressure.

FIG. 12 shows a relation between unevenness of the surface of the selectively grown compound semiconductor crystal and growth pressure in the growth atmosphere.

The abscissa of FIG. 12 shows growth pressure in growth atmosphere, and the ordinate shows normalized spike height. FIG. 12 shows the normalized spike height $S_h$ when the stripe portion 13 is formed on the InP substrate to have the width of 20 μm using the selective growth mask shown in FIG. 1 and then the InP layer is selectively grown on the InP substrate after the pressure in the growth atmosphere being varied.

The normalized spike height $S_h$ is defined as the value ($\Delta h/h$) which is obtained by dividing a difference ($\Delta h = h_1 - h$) between the maximum thickness ($h_1$) of the crystal in regions near both ends of the stripe portion 13 and the thickness (h) of the crystal in the center of the stripe portion 13 by the thickness (h) of the crystal in the center of the stripe portion 13.

From FIG. 12, it has been seen that the normalized spike height $S_h$ is in excess of 0.3 (30%) if the pressure in the growth atmosphere is 100 Torr or more. Therefore, there are caused some drawbacks when the crystal layer formed in the stripe portion 13 is patterned by photolithography technique. As one of such drawbacks, for example, there can be listed difficulty in focusing the beam on the resist because of large unevenness of the crystal layer, which lowers pattern precision of the resist.

However, since the normalized spike height $S_h$ can be suppressed within about 0.03 (3%) if the pressure in the growth atmosphere is 10 Torr or less, evenness of the crystal formed in the stripe portion 13 can be improved.

FIG. 12 is the experimental result obtained when the width of the stripe portion is set to be 20 μm, but the same result may be obtained when the width is set within 20 to 60 μm.

As mentioned above, according to the fabricating method of the compound semiconductor device of the present invention, since the selective ratio in the selective growth of the crystal using the selective growth masks can be controlled during growing the crystal, a plurality of semiconductor devices having different film thicknesses can be formed simultaneously on the single compound semiconductor substrate, so that the margin of the device design can be improved. In addition, the fabricating method can significantly contribute improvement of characteristics of the monolithic compound semiconductor device and yield. thereof in manufacturing.

As discussed above, according to the present invention, in the growing process of the compound semiconductor layers wherein the growth rate or the composition of the compound semiconductor layers would be differentiated in the areas near the selective growth masks and the areas far from the selective growth masks, by forming the selective growth masks on part of the surface of the growth substrate and then growing the compound semiconductor layers by means of chemical vapor deposition in areas where the selective growth masks are not formed, the selective growth ratio of the compound semiconductor layers can be smaller as the thickness of the stagnant layer becomes thinner, and then the selective growth ration of the compound semiconductor layers can be smaller as the mean free path becomes longer since the ratio of the thickness of the stagnant layer of the material seed generated on the substrate and mean free path of the material seed in vapor phase can be changed corresponding to the compound semiconductor layers to be selectively grown.

The thickness of the stagnant layer can be thinner as the total gas flow amount is increased more and more. The mean free path can be longer as the pressure in the growth atmosphere is reduced.

Second Embodiment

Figure 13:
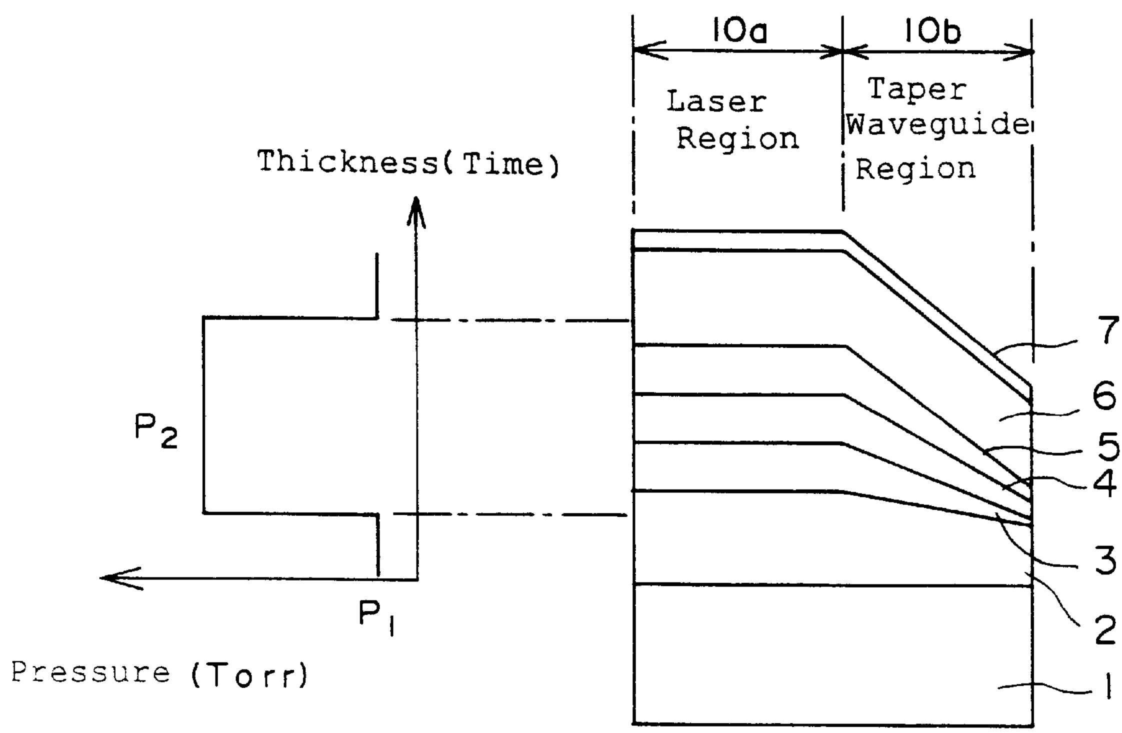
FIG. 13 is a view showing a relation between a change in the growth pressure and a growth time and a relation between the growth pressure and the layer position when compound semiconductor layers are formed by the selective growth.

In the above manufacturing method of the optical semiconductor device, the selective growth ratio of the crystal has been adjusted by varying the growth pressure when forming the compound semiconductor. For example, the cladding layers 2, 6 are formed at low pressure of 10 Torr while the active layer 4 and the guide layers 3, 5 are formed at high pressure of 180 Torr. As shown in FIG. 13, change of the growth pressure is not effected between the growing of the guide layers 3, 5 and the growing of the cladding layers 2, 6, but it is effected during the crystal growth of the cladding layers 2, 6 so as to make fine a boundary state between different kinds of compound semiconductor layers.

On the other hand, the p type impurity or the n type impurity is doped into the crystal of the compound semiconductor when the compound semiconductor constituting the cladding layers 2, 6 are grown. At that time, it has become apparent based on the experiment by the inventors of the present invention that, when the pressure is changed during growing the crystal, a phenomenon that an introduced amount of dopant is also changed according to change of the pressure occurs.

Next, the experimental result will be explained. In this experiment, a monosilane ($SiH_4$) gas has been used as a supply source of the n type impurity, and a dimethylzinc (DMZn) gas has been used as a supply source of the p type impurity.

Figure 14A:
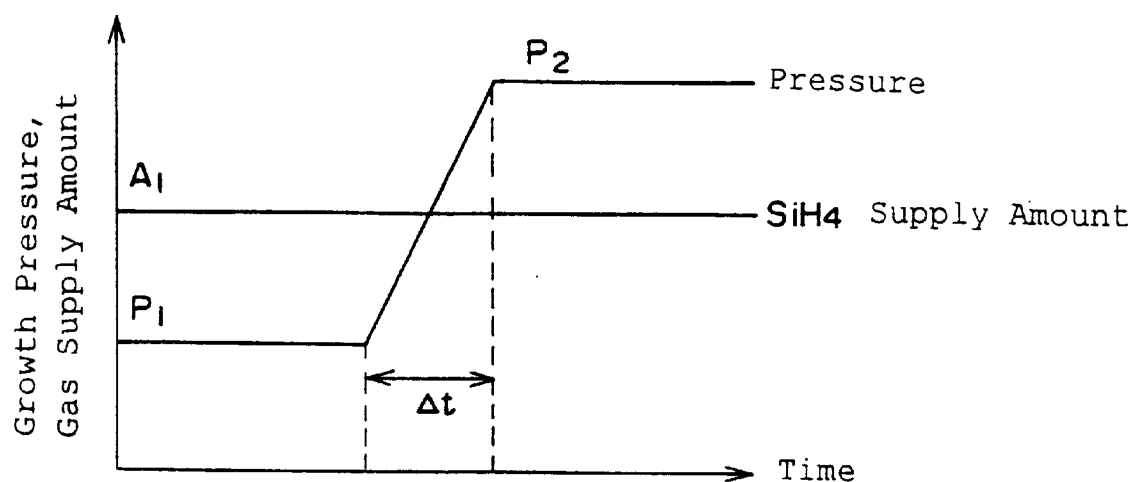
FIG. 14A is a view showing that, when the n type compound semiconductor layer is formed by the selective growth, only the growth pressure is changed as time passes on while a $SiH_4$ gas supply amount is not changed with the elapse of time.

FIG. 14A is a view showing a change of a $SiH_4$ gas supply amount with the elapse of time during growing the lower InP cladding layer 2 and a change of the growth pressure with the passage of time during growing the lower InP cladding layer 2. FIG. 14A shows that, while a supply amount of $SiH_4$ gas being kept constant during growing the lower InP cladding layer 2, the growth pressure is increased from $P_2$ to $P_1$ ($P_2$>$P_1$) for a time Δt during growing the lower InP cladding layer 2.

Figure 14B:
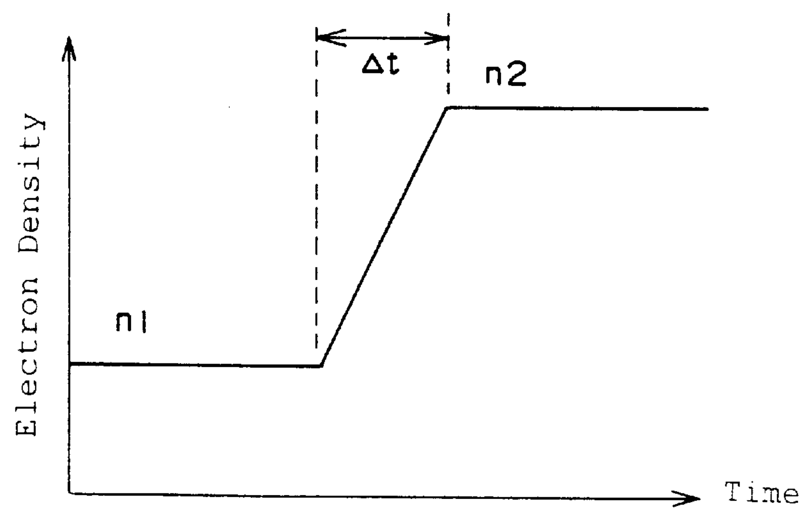
FIG. 14B is a view showing a relation between the growth time and electron density in the n type compound semiconductor layer obtained when only the growth pressure is changed.

FIG. 14B shows electron density in the lower InP cladding layer 2 with elapsed time required for growing the InP cladding layer 2. Referring to FIG. 14B, it has been found that electron density is increased from $n_1$ to $n_2$ ($n_2$>$n_1$) by changing the growth pressure. Here, $n_1$ denotes a designed value. An increase of electron density means an increase of the silicon containing amount.

Figure 15A:
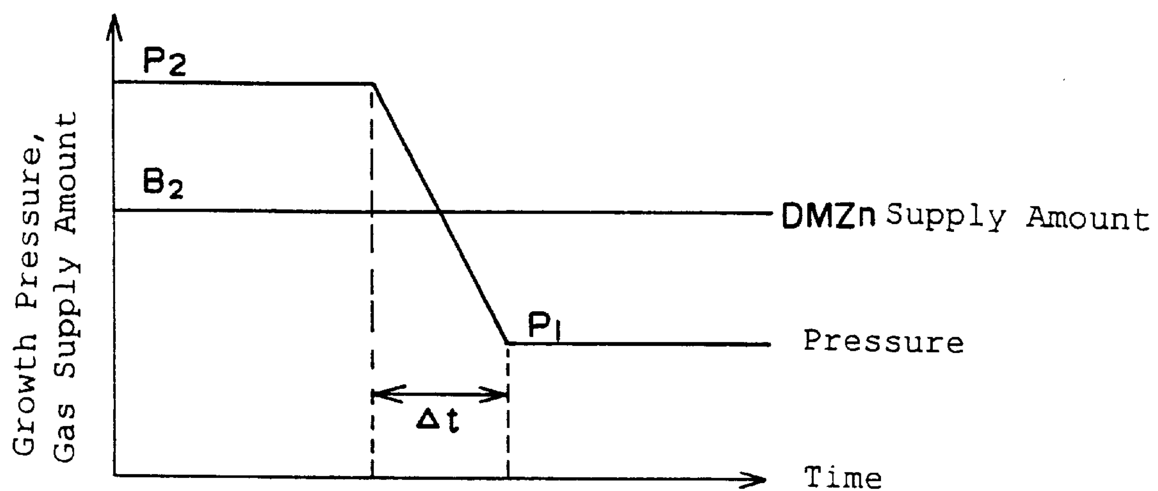
FIG. 15A is a view showing that, when the p type compound semiconductor layer is formed by the selective growth, only the growth pressure is changed as time passes on while a DMZn gas supply amount is not changed with the elapse of time.

FIG. 15A is a view showing a change of a DMZn gas supply amount with the elapse of time during growing the upper InP cladding layer 6 and a change of the growth pressure with the passage of time during growing the upper InP cladding layer 6. FIG. 15A shows that the growth pressure is decreased from $P_2$ to $P_1$ for a time Δt during growing the upper InP cladding layer 6 while a supply amount of the DMZn gas being kept constant during growing the upper InP cladding layer 6.

Figure 15B:
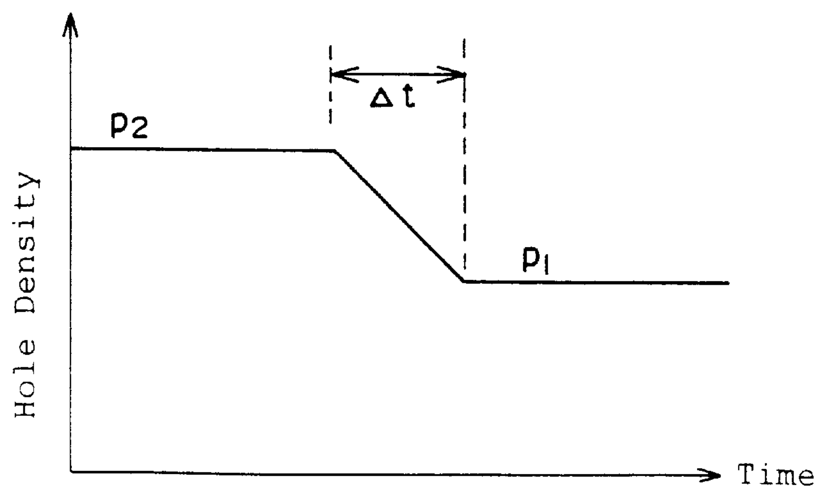
FIG. 15B is a view showing a relation between the growth time and hole density in the p type compound semiconductor layer obtained when only the growth pressure is changed.

FIG. 15B shows hole density in the upper InP cladding layer 6 with elapsed time required for growing the InP cladding layer 6. Referring to FIG. 15B, it has been found that hole density is decreased from $P_2$ to $P_1$ ($p_2$>$p_1$) by changing the growth pressure. Here, $P_2$ denotes a designed value. A reduction of hole density means a reduction of the zinc containing amount.

As shown in FIG. 13, in these experiments, the growth pressure is increased during growing the lower InP cladding layer 2, but the growth pressure is decreased during growing the upper InP cladding layer 6.

As shown in FIGS. 14 and 15, if carrier density distribution (impurity concentration distribution) becomes uneven in the cladding layers 2, 6 in the film thickness direction, the pn junction portion in the semiconductor layers is moved to an undesired location due to impurity diffusion, and the energy band structure is not formed as being designed, and then electric resistance distribution in the semiconductor laser is shifted. As a result, the designed characteristic of the optical semiconductor device cannot be obtained.

Therefore, in order to avoid the above drawbacks, the inventors of the present invention have employed the following method.

Figure 16:
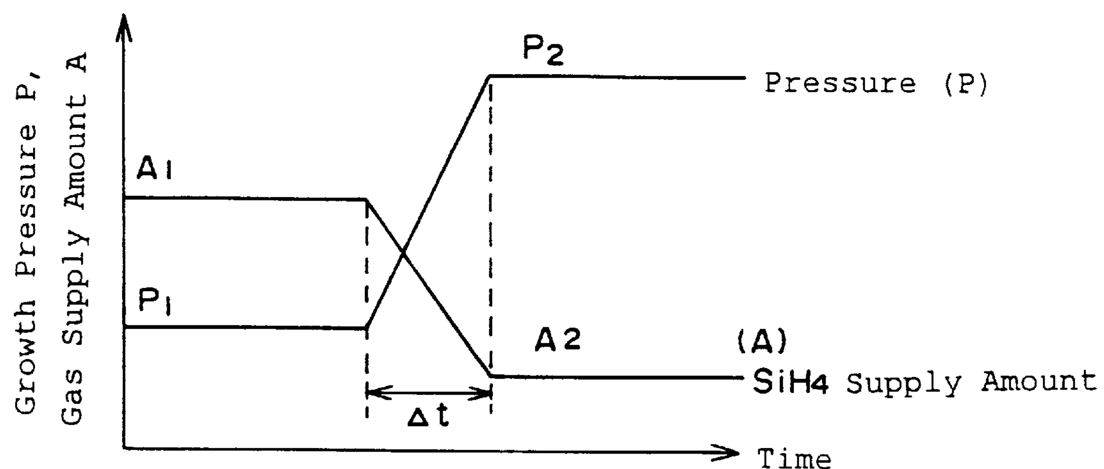
FIG. 16 is a view showing that the growth pressure and the $SiH_4$ gas supply amount are changed according to the elapsed time in case the n type compound semiconductor layers are formed by the selective growth.

That is, as shown in FIG. 16, the growth pressure is risen from $P_1$ to $P_2$ during growing the n type InP cladding layer 2, and a supply amount of $SiH_4$ gas (rate of flow) is reduced from $A_1$ to $A_2$ ($A_2$<$A_1$) when changing the growth pressure. The $SiH_4$ supply amount $A_1$ is designated to provide electron density $n_1$ as the designed value to the cladding layer 2.

Figure 18:
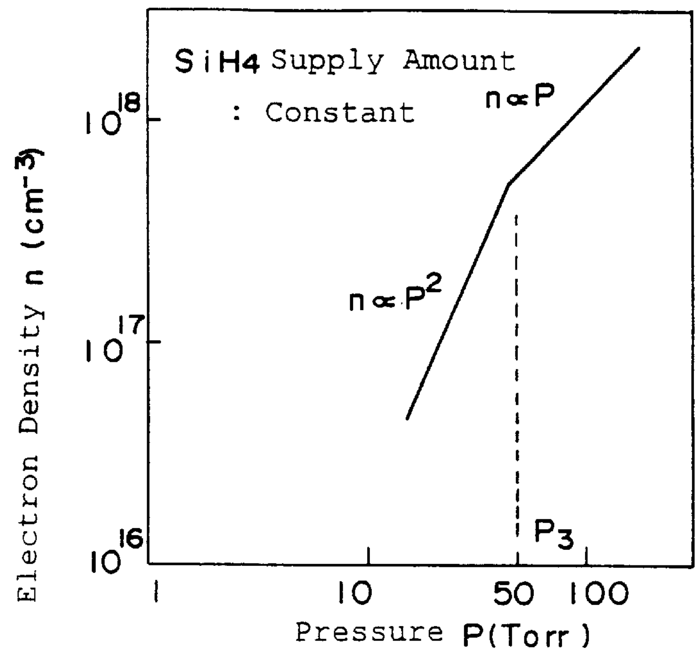
FIG. 18 is a characteristic view showing a relation between the growth pressure and the electron density in case the n type compound semiconductor is grown with keeping the supply amount of $SiH_4$ gas constant.

The experimental result to confirm how the $SiH_4$ supply amount should be changed from $A_1$ to $A_2$ is shown in FIG. 18. In other words, the inventors of the present invention have found the fact that, if the growth pressure is varied with fixing the $SiH_4$ gas supply amount, electron density n in the compound semiconductor varies in proportion to square of the growth pressure P when the growth pressure is equal to or smaller than a certain pressure $P_3$ while electron density n in the compound semiconductor varies in proportion to the growth pressure P when the growth pressure is equal to or larger than the certain pressure $P_3$. The certain pressure $P_3$ is different in individual crystal growing apparatuses. In FIG. 16, a magnitude of the pressure $P_3$ is set to be 50 Torr.

Accordingly, ratios ($A_2/A_1$) of the supply amount $A_2$ and the supply amount $A_1$ of the $SiH_4$ gas to maintain electron density n in the cladding layer 2 constant are classified into the following three relations.

| | | |
|---|---|---|
| 1) | For $P_1 < P_2 \leqq P_3$, $A_2/A_1 = (P_1/P_2)^2$ | (11) |
| 2) | For $P_1 \leqq P_3 \leqq P_2$, $A_2/A_1 = (P_1/P_3)^2(P_3/P_2)$ | (12) |
| 3) | For $P_3 \leqq P_1 < P_2$, $A_2/A_1 = P_1/P_2$ | (13) |

Figure 17:
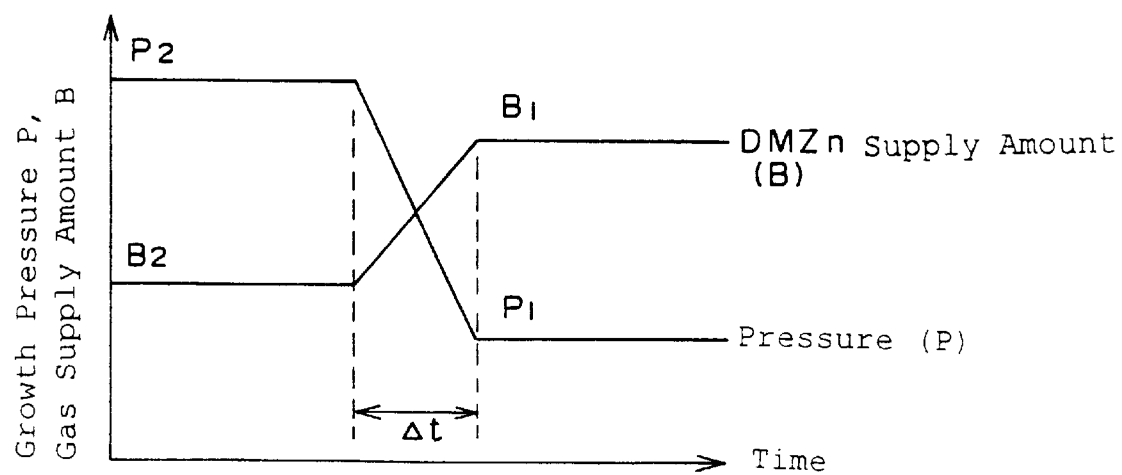
FIG. 17 is a view showing that the growth pressure and the DMZn gas supply amount are changed according to the elapsed time in case the p type compound semiconductor layers are formed by the selective growth.

On the contrary, as shown in FIG. 17, the growth pressure is reduced from $P_2$ to $P_1$ in the course of growing the p type InP cladding layer 6, and a supply amount of the DMZn gas (rate of flow) is increased from $B_2$ to $B_1$ ($B_2$<$B_1$) at the time when the growth pressure is varied. The DMZn supply amount $B_1$ is designated to provide hole density $P_1$ as the designed value to the cladding layer 6.

Figure 19:
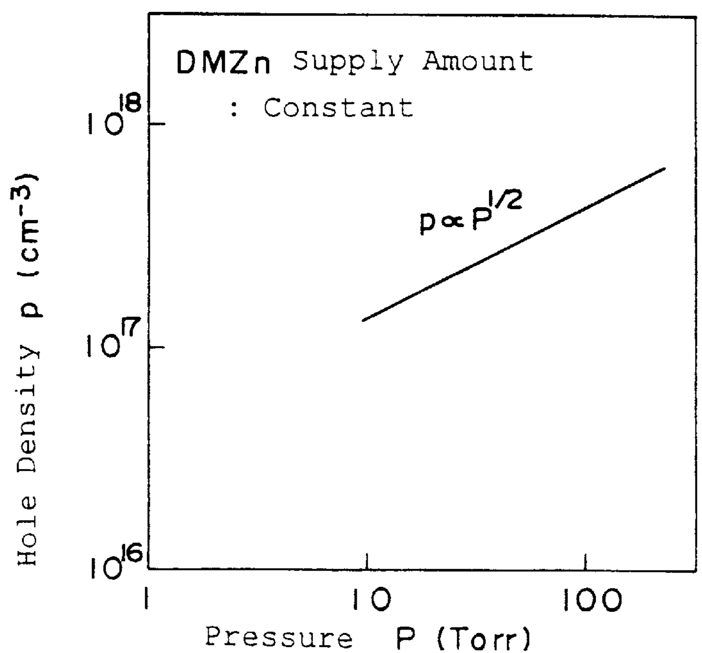
FIG. 19 is a characteristic view showing a relation between the growth pressure and the hole density in case the p type compound semiconductor is grown with keeping the supply amount of DMZn gas constant.

Then, The experimental result to confirm how the DMZn supply amount should be changed from $B_1$ to $B_2$ is shown in FIG. 19. In other words, the inventors of the present invention have found the fact that hole density p in the compound semiconductor varies in proportion to the one-half power of the growth pressure P when the growth pressure is varied while keeping the DMZn gas supply amount constant.

Accordingly, a ratio ($B_1/B_2$) of the supply amount $B_1$ and the supply amount $B_2$ of the DMZn gas to maintain hole density p in the cladding layer 6 constant is defined by the following relation.

$$B_1/B_2=(P_2/P_1)^{1/2} \quad (14)$$

As has been described above, with considering the relation among the carrier density, the dopant supply gas, and the growth pressure, the compound semiconductor layer structure has been formed by using the selective growth mask shown in FIG. 9A under the following conditions.

As shown in FIG. 9A, upon growing the crystal, a length L and a width W of two rectangular regions $M_{12}$, $M_{13}$ as the selective growth masks 9 formed on the n-InP substrate 1 are 600 μm and 300 μm, respectively. A width $W_1$ of the stripe region 8*a* of the opening portion 8 of the selective growth mask 9 is 40 μm.

On the n type InP substrate 1 are formed the n type-InP cladding layer 2 of a 0.5 μm film thickness, the n type $In_xGa_{1-x}As_yP_{1-y}$ (x=0.85, y=0.33) guide layer 3 of a 0.1 μm film thickness, a non-doped MQW active layer 4 of a 0.1 μm film thickness, a non-doped $In_xGa_{1-x}As_yP_{1-y}$ guide layer 5 of a 0.1 μm film thickness, the p type InP cladding layer 6 of a 0.5 μm film thickness, and the p type InGaAsP contact layer 7 of a 0.1 μm film thickness by MOVPE method. By way of illustration, film thicknesses of respective layers 2 to 7 are shown as those of the stripe region 8*a*.

In this event, a composition wavelength of the $In_xGa_{1-x}As_yP_{1-y}$ constituting two guide layers 3, 5 is 1.1 μm. The MQW active layer 4 has a structure wherein a plurality of barrier layers formed of InGaAsP having a composition wavelength 1.1 μm and a plurality of well layers formed of $In_{x'}Ga_{1-x'}As_{y'}P_{1-y'}$ (x'=0.72, y'=0.61) having a composition wavelength 1.3 μm are alternatively formed.

In the MOVPE growth method, trimethylindium (TMI) as material of indium (In), triethylgallium (TEG) as material of gallium (Ga), arsine ($AsH_3$) as material of arsenic (As), and phosphine ($PH_3$) as material of phosphorus (P) have been used respectively.

At the time of growing, a substrate temperature is 600° C., and a total rate of flow of hydrogen is 6 l/min.

When the InP cladding layers 2, 6 being grown, a TMI supply amount is set as 0.4 ccm and a $PH_3$ supply amount is set as 40 ccm, and the $SiH_4$ gas is used as the n type impurity and the DMZn gas is used as the p type impurity. Then, the n type InP cladding layer 2 to the p type InP cladding layer 6 are grown by changing the growth pressure and the impurity gas supply amount, as shown in the following examples.

However, it has been confirmed by the preliminary examination that the $SiH_4$ supply amount is 0.02 ccm at the growth pressure of 10 Torr so as to attain dose (electron density) of $5\times10^{17}$ atoms/cm$^3$ in the n type InP cladding layer 2, and that the DMZn supply amount is 0.004 ccm at the growth pressure of 150 Torr so as to attain dose (hole density) of $5\times10^{17}$ atoms/cm$^3$ in the p type InP cladding layer 6. Under the above conditions, the growth pressure $P_3$ is 50 Torr according to the above expressions (11) to (13).

First Example

As shown in FIG. 16, when growing the n type InP cladding layer 2, the growth pressure and the $SiH_4$ supply amount are varied.

The n type InP cladding layer 2 is first grown up to a thickness of 0.4 μm at the growth pressure of 10 Torr ($P_1$), then grown by a further thickness of 0.1 μm at the increased growth pressure of 50 Torr ($P_2$) Subsequently, the $SiH_4$ supply amount $A_1$ is set to be 0.02 ccm at the growth pressure of 10 Torr ($P_1$), and the $SiH_4$ supply amount $A_2$ is set to be 0.0008 ccm at the growth pressure of 50 Torr ($P_2$). The supply amount $A_2$ is given as $A_2=(10/50)^2A_1=0.0008$ based on the above equation (1).

After this, the guide layers 3, 5 and the MQW active layer 4 are grown at 50 Torr. The selective growth ratios of these layers are increased to enhance a difference in film thickness between the active region 10*a* and the waveguide region 10*b*. Then, at the time of growing the p type InP cladding layer 6, the growth pressure and the DMZn supply amount are varied as shown in FIG. 17.

The p type InP cladding layer 6 is first grown up to a thickness of 0.1 μm with holding the growth pressure of 50 Torr ($P_2$) then grown by a further thickness of 0.4 μm at the lowered growth pressure of 10 Torr ($P_1$). In this case, the DMZn supply amount $B_2$ is set to be 0.0069 ccm at the growth pressure of 50 Torr ($P_2$), and the DMZn supply amount $B_1$ is set to be 0.0155 ccm at the growth pressure of 10 Torr ($P_1$).

The supply amount $B_2$ is given as $B_2=(150/50)^{1/2}\times0.004=0.0069$ based on the above equation (14), and the supply amount $B_1$ is also given as $B_1=(50/10)^{1/2}B=0.0155$ based on the above equation (14).

The growth pressure is varied for less than several minutes, and supply of the TMI is ceased and only $PH_3$ is supplied during that period. This is because leakage of group V atoms from the compound semiconductor layers must be prevented. This is true in the following examples.

After the p type cladding layer 6 has been formed as above, the InGaAsP contact layer 7 is formed while holding the growth pressure at 10 Torr.

Second Example

As shown in FIG. 16, when growing the n type InP cladding layer 2, the growth pressure and the $SiH_4$ supply amount are varied.

The n type InP cladding layer 2 is first grown up to a thickness of 0.4 μm at the growth pressure of 10 Torr ($P_1$), then grown by a further thickness of 0.1 μm at the raised growth pressure of 150 Torr ($P_2$) Subsequently, the $SiH_4$ supply amount $A_1$ is set to be 0.02 ccm at the growth pressure of 10 Torr ($P_1$), and the $SiH_4$ supply amount $A_2$ is set to be 0.00027 ccm at the growth pressure of 150 Torr ($P_2$). The supply amount $A_2$ is given as $A_2=(10/50)^2(50/150)A_1=0.00027$ based on the above equation (12).

After this, the guide layers 3, 5 and the MQW active layer 4 are grown at 150 Torr. The selective growth ratios of these layers are increased to enhance a difference in film thickness between the active region 10*a* and the waveguide region 10*b*.

Then, at the time of growing the p type InP cladding layer 6, the growth pressure and the DMZn supply amount are varied as shown in FIG. 17.

The p type InP cladding layer 6 is first grown up to a thickness of 0.1 μm with holding the growth pressure of 150 Torr ($P_2$), then grown by a further thickness of 0.4 μm at the lowered growth pressure of 10 Torr ($P_1$). In this case, the DMZn supply amount $B_2$ is set to be 0.004 ccm at the growth pressure of 150 Torr ($P_2$), and the DMZn supply amount $B_1$ is set to be 0.0155 ccm at the growth pressure of 10 Torr ($P_1$).

The supply amount $B_2$ is given as $B_2=(150/150)^{1/2}\times 0.004=0.004$ based on the above equation (14), and the supply amount $B_1$ is also given as $B_1=(50/10)B_2=0.0155$ based on the above equation (14).

Like this, after the p type cladding layer 6 has been formed, the InGaAsP contact layer 7 is formed while holding the growth pressure at 10 Torr.

Third Example

As shown in FIG. 16, when growing the n type InP cladding layer 2, the growth pressure and the $SiH_4$ supply amount are varied.

The n type InP cladding layer 2 is first grown up to a thickness of 0.4 $\mu$m at the growth pressure of 50 Torr ($P_1$), then grown by a further thickness of 0.1 $\mu$m at the raised growth pressure of 150 Torr ($P_2$). Subsequently, the $SiH_4$ supply amount $A_1$ is set to be 0.0008 ccm at the growth pressure of 50 Torr ($P_1$), and the $SiH_4$ supply amount $A_2$ is set to be 0.000027 ccm at the growth pressure of 150 Torr ($P_2$).

The supply amount $A_1$ is given as $A_1=(10/50)^2\times 0.02=0.0008$ based on the above equation (12). The supply amount $A_2$ is given as $A_2=(50/150)^2A_1=0.00027$ based on the above equation (13).

After this, the guide layers 3, 5 and the MQW active layer 4 are grown at 150 Torr. The selective growth ratios of these layers are increased to enhance a difference in film thickness between the active region and the waveguide region.

Then, at the time of growing the p type InP cladding layer 6, the growth pressure and the DMZn supply amount are varied as shown in FIG. 17.

The p type InP cladding layer 6 is first grown up to a thickness of 0.1 $\mu$m with holding the growth pressure of 150 Torr ($P_2$), then grown by a further thickness of 0.4 $\mu$m at the lowered growth pressure of 50 Torr ($P_1$). In this case, the DMZn supply amount $B_2$ is set to be 0.004 ccm at the growth pressure of 150 Torr ($P_2$), and the DMZn supply amount $B_1$ is set to be 0.0069 ccm at the growth pressure of 50 Torr ($P_1$).

The supply amount $B_1$ is also given as $B_1=(150/50)^{1/2}B_2=0.0069$ based on the above equation (14).

Like this, after the p type cladding layer 6 has been formed, the InGaAsP contact layer 7 is formed while holding the growth pressure at 50 Torr.

Figure 20:
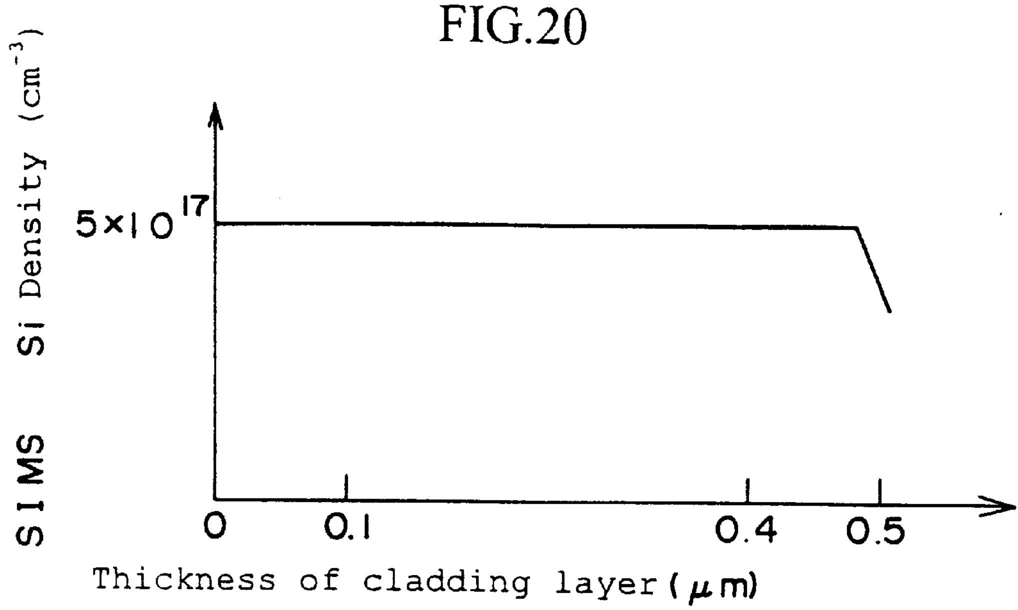
FIG. 20 is a view showing a distribution of silicon density in the n type compound semiconductor layer in case the n type compound semiconductor layer is grown while changing the growth pressure and the $SiH_4$ gas supply amount during the growing the compound semiconductor layer.
Figure 21:
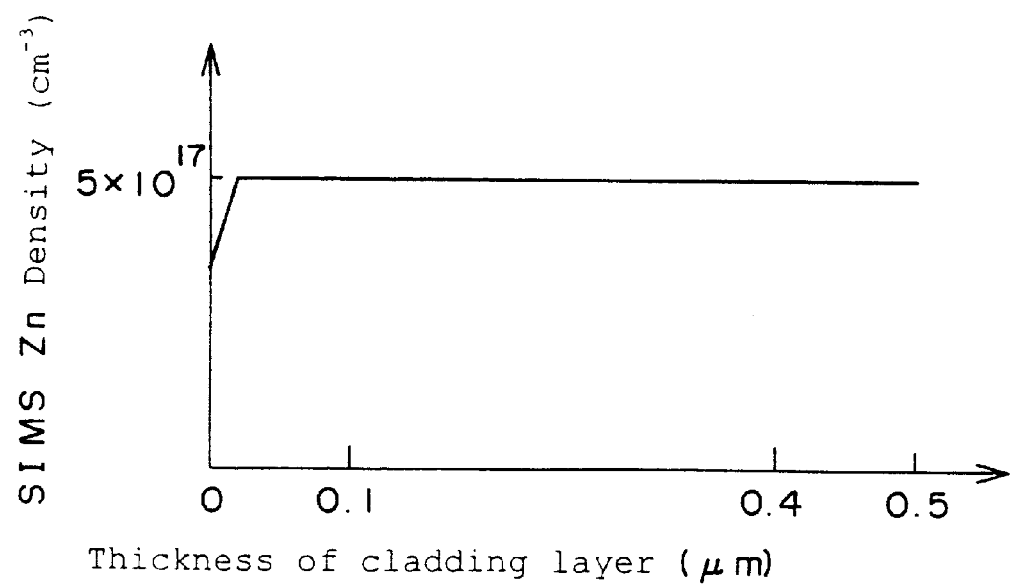
FIG. 21 is a view showing a distribution of zinc density in the p type compound semiconductor layer in case the p type compound semiconductor layer is grown while changing growingly the growth pressure and the DMZn gas supply amount during the growing the compound semiconductor layer.

With regard to the above three examples, silicon density in the n type InP cladding layer 2 and zinc density in the p type InP cladding layer 6 have been analyzed by SIMS, resulting in the results as shown in FIGS. 20 and 21. In all cases of the first to third examples, silicon density and zinc density of $5\times10^{17}$ atoms/cm$^3$ could be obtained in the cladding layers 2, 6 both having a thickness of 0.5 $\mu$m throughout an entire range in the thickness direction. This result suggests that carrier density in the InP cladding layers 2, 6 can be adjusted to be even if the growth pressure is changed. Thereby, in the compound semiconductor constituting the optical semiconductor device, the location of the pn junction, the energy band structure, and the electric resistance distribution can be realized as being designed.

By the way, the reason why respective carrier density curves is lowered at one end of FIGS. 20 and 21 is due to respective diffusions of the n type impurity and the p type impurity into the guide layers 3, 5, and it is not caused by the changed of the growth pressure.

Though the n type impurity is doped into the lower cladding layer 2 while the p type impurity is doped into the upper cladding layer 6 in the above examples, n type and p type may be inverted. In such case, the DMZn gas supply amount would be reduced according to raise in the growth pressure in the lower cladding layer 2 while the $SiH_4$ gas supply amount would be increased according to fall in the growth pressure in the upper cladding layer 6.

The second embodiment above may be applied to the case wherein the group III–V semiconductor layer comprising the group III material including at least one of In, Ga, Al and the group V material including at least one of As, P is grown. In that case, the growth conditions, and impurity dose are not limited to the above embodiments. In addition, sulfur (S), selenium (Se) as well as silicon (Si) may be used as the n type impurity and cadmium (cd) as well as Zn may also be used as the p type impurity. In that case, the introduction amount of the impurity gas must be changed depending on the change in the growth pressure.

As discuss above, according to the present invention, in case the growth pressure is changed during growing the compound semiconductor layers into which the n type impurity or the p type impurity is introduced, dose of the impurity in the compound semiconductor layers can be adjusted by the change of the growth pressure to be constant throughout the entire area since the gas including the n type impurity or the p type impurity is changed at the same time.

In case a supply amount of the gas for introducing the n type impurity is constant, it has been confirmed by the experiment that dose of the n type impurity in the compound semiconductor layers is divided into a range where it varies in proportional to square of the growth pressure and another range where it varies in proportional to the growth pressure. Therefore, based on these relation, dose of the n type impurity can be held constant by adjusting the supply amount of the gas for introducing the n type impurity.

Further, when introducing the p type impurity, dose of the p type impurity in the compound semiconductor varies proportionally to the one-half power of the growth pressure. Therefore, based on this relation, dose of the p type impurity can be kept constant by adjusting the supply amount of the gas for introducing the p type impurity.

If dose in the compound semiconductor layers is constant, location of the pn junction generated by impurity diffusion, the energy band gap and resistance distribution can be obtained as they being designed, so that the good characteristic of the compound semiconductor device can be achieved.

Third Embodiment

Next, inner strain in the compound semiconductor layer formed by the selective growth will be explained.

If the film thickness of the compound semiconductor layer is varied by the selective growth technique to realize the above taper waveguide, composition of the semiconductor also varies according to difference in the film thickness. Therefore, the film is more susceptible to compressive strain as the film thickness becomes thicker.

Figure 22A:
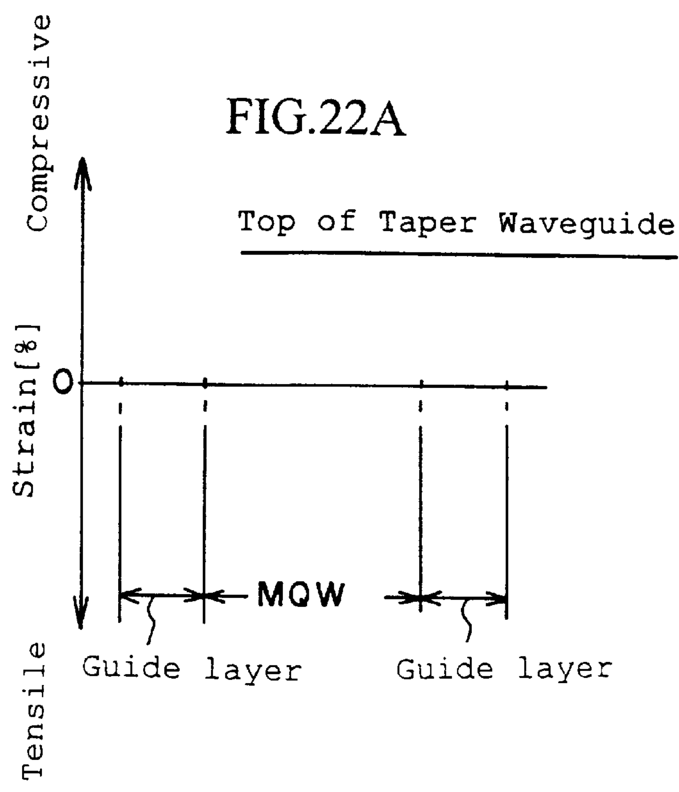
FIG. 22A is a view showing a stress distribution in a top portion of a taper waveguide of the conventional optical semiconductor device.
Figure 22B:
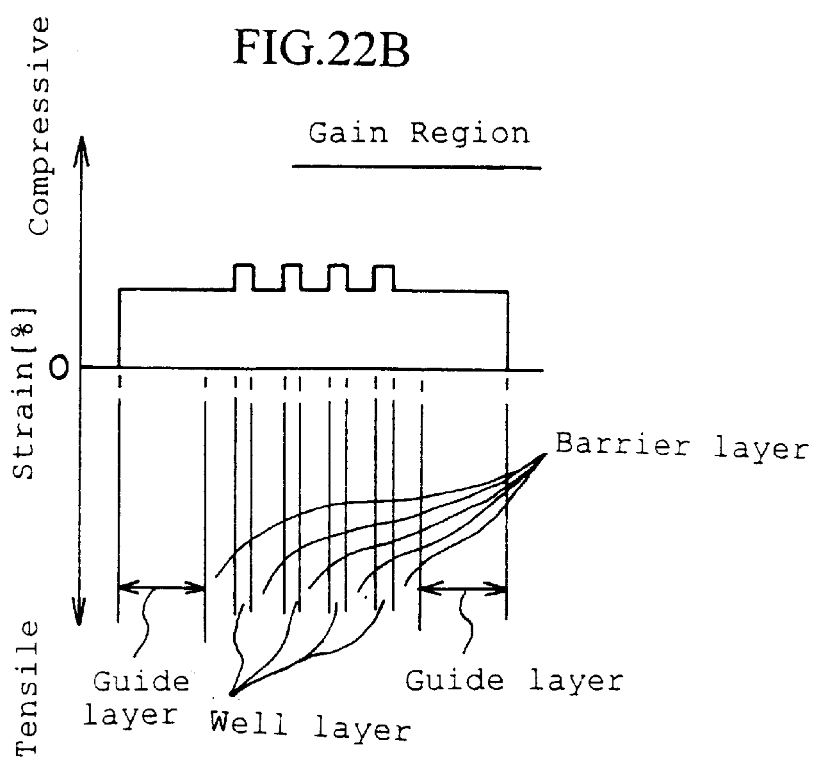
FIG. 22B is a view showing a stress distribution in a gain region of the conventional optical semiconductor device in FIG. 22A.

By way of example, unless stress is applied to the thin top portion of the taper waveguide, as shown in FIG. 22A, compressive strain would be caused in the thick layer of the semiconductor laser, as shown in FIG. 22B. Therefore, excessive strain is caused in the quantum well layer, the barrier layer, the guide layer, etc. of the semiconductor laser.

Thus, if the layer number of the quantum well layer and the barrier layer in the semiconductor laser is increased or if a strain amount in the quantum well layer is increased to improve a high temperature characteristic of the semiconductor laser, excessive strain is caused in these layers, so that crystal dislocation is readily generated. In other words, strain generated in the semiconductor laser region becomes excessive and therefore superlattice would be relaxed.

To reduce excessive strain in the superlattice structure, the following structure will be adopted.

Figure 23A:
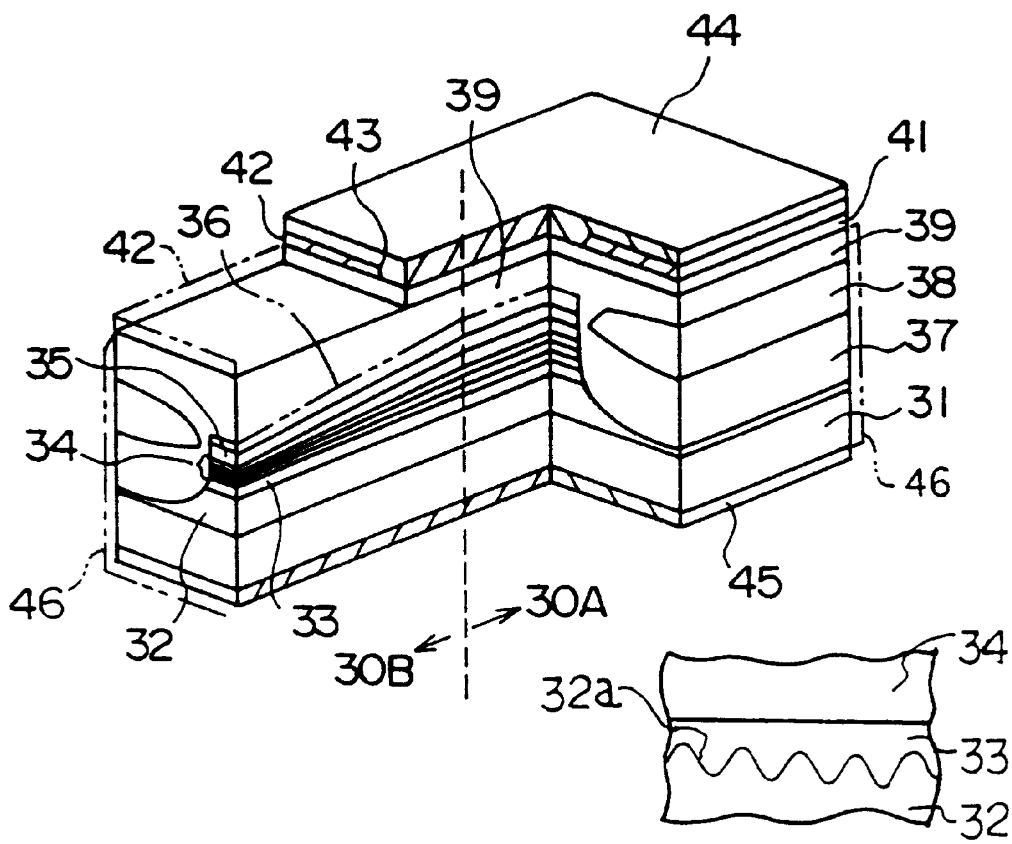
FIG. 23A is a perspective view showing an optical semiconductor device according to a third embodiment of the present invention.

FIG. 23A is a perspective view showing, partially in section, an integrated Fabry-Perot semiconductor laser and taper waveguide according to a third embodiment of the present invention.

First a structure of the device will be explained.

Referring to FIG. 23A, an n type InP cladding layer 32, a first optical guide layer 33 formed of $In_xGa_{1-x}As_yP_{1-y}$ (0<x<1, 0<y<1), an MQW layer 34, a second optical guide layer 35 formed of $In_xGa_{1-x}As_yP_{1-y}$ and a p type InP cladding layer 36 are sequentially formed by epitaxial growth on an n type InP substrate 31. These layers are formed as a stripe structure in the light travel direction by photolithography using a mask and etching.

Figure 23B:
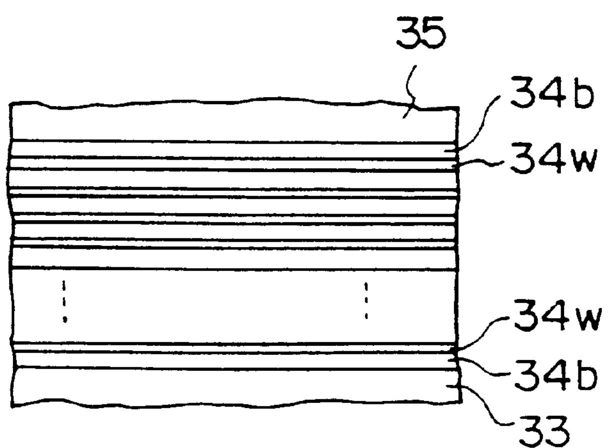
FIG. 23B is a sectional view showing a layer structure of an MQW layer of the optical semiconductor device in FIG. 23A.

As shown in FIG. 23B, the MQW layer 34 has the superlattice structure in which well layers 34*w* and barrier layers 34*b* are alternatively formed. The well layers 34*w* are in ten layers and the barrier layers 34*b* are in eleven layers. The well layers 34*w* are arranged to put the barrier layers 34*b* therebetween. The well layers 34*w* are formed of $In_{x1}Ga_{1-x1}As_{y1}P_{1-y1}$ (0<x1<1, 0<y1<1) and the barrier layers 34*b* are formed of $In_{x2}Ga_{1-x2}As_{y2}P_{1-y2}$ (0<x2<1, 0<y2<1).

Figure 24:
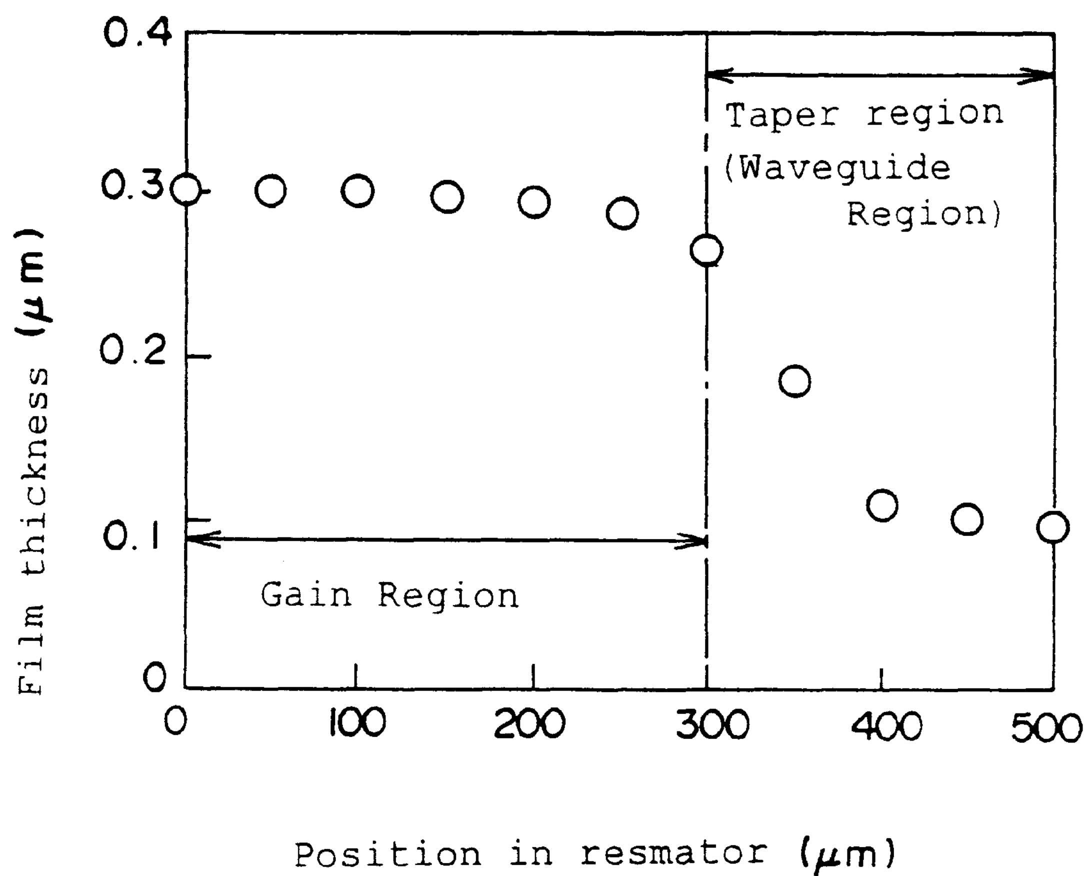
FIG. 24 is a view showing a film thickness distribution of the gain region and the waveguide region of the layer formed by the selective growth in the third embodiment of the present invention.

At least the first optical guide layer 33, the MQW layer 34, and the second optical guide layer 35 of the above layers are so formed by the selective growth technique that they are even in the gain region 30A and are in a taper fashion in the waveguide region 30B. According to the selective growth technique, for example, as shown in FIG. 24, if the top (optical output end) of the taper portion of the waveguide region 30B in the stripe structure is 0.1 $\mu$m in thickness, then the gain region 30A has a thickness of 0.3 $\mu$m. In this event, a selective growth ratio is “3”.

On both sides of the stripe structure, a first p type InP layer 37 and a second n type InP layer 38 are grown in order. A second p type InP layer 39 is formed on the second n type InP layer 38 and the p type InP cladding layer 36.

A contact layer 41 of $p^+$ type InGaAsP is formed on the second p type InP layer 39 in the gain region 30A and its neighbor region. The second p type InP layer 39 in the waveguide region 30B and the contact layer 41 are respectively covered with a protection film 42 of $SiO_2$. An opening 43 is formed in the upper protection film 42 of the stripe structure, and a p-side electrode 44 is then connected to the contact layer 41 through the opening 43. An n-side electrode 45 is connected to the lower surface of the n-InP substrate 31. In addition, reflection films are formed on both ends of the stripe structure.

Next, details of the stripe structure described above will be explained.

(1) First, an optical output end of a taper stripe structure formed in the waveguide region 30B will be explained.

Figure 25A:
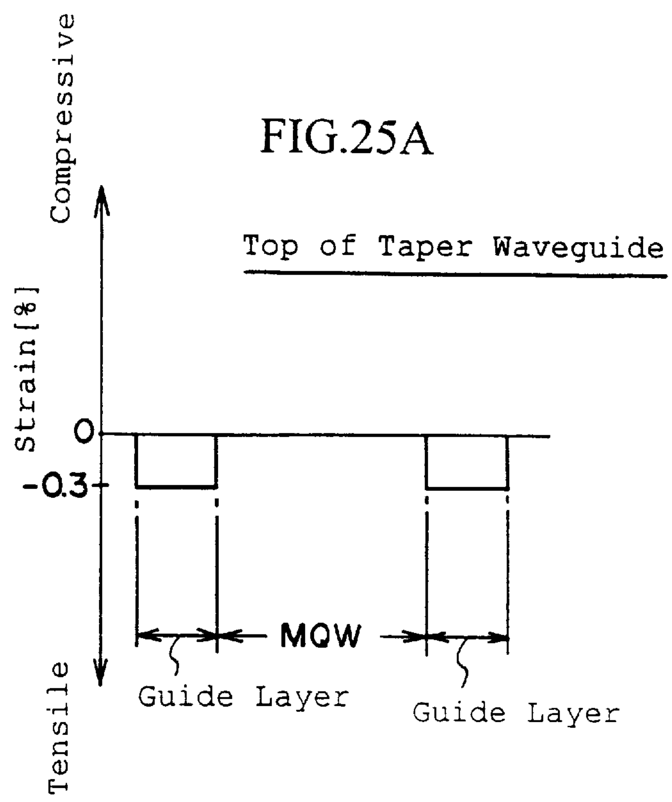
FIG. 25A is a view showing a stress distribution in a top portion of a taper waveguide of the optical semiconductor device according to the third embodiment of the present invention.

At the optical output end, a composition ratio x of $In_xGa_{1-x}As_yP_{1-y}$ constituting the first and second optical guide layers 33, 35 is 0.85 and a composition ratio y thereof is 0.24. Film thicknesses of the first and second optical guide layers 33, 35 at the optical output end are respectively 15 nm. As shown in FIG. 25A, stress of about −0.3%, i.e., tensile stress of 0.3% is applied to the optical output end of the first and second optical guide layers 33, 35. At the optical output end, a composition ratio x1 of $In_{x1}Ga_{1-x1}As_{y1}P_{1-y1}$ constituting the well layer 34*w* of the MQW layer 34 is 0.72 and a composition ratio y1 thereof is 0.61. A composition ratio x2 of $In_{x2}Ga_{1-x2}As_{y2}P_{1-y2}$ constituting the barrier layer 34*b* is 0.85 and a composition ratio y2 thereof is 0.33. In addition, at the optical output end, the well layers 34*w* have a thickness of 2 nm per one layer, and the barrier layer 34*b* have a thickness of 5 nm per one layer. In such structure, stress becomes zero at the optical end of the MQW layer 34 including the well layers 34*w* and the barrier layers 34*b* to achieve lattice matching.

As shown in FIG. 25A, a relation between layers and film stress in the waveguide region 30B is illustrated. In this case, optical waveguide is scarcely affected even if tensile stress is applied to the first and second optical guide layers 33, 35.

(2) Next, the flat stripe structure in the gain region 30A will be explained.

In the gain region 30A, a composition ratio x of $In_xGa_{1-x}As_yP_{1-y}$ constituting the first and second optical guide layers 33, 35 is 0.92 and a composition ratio y thereof is 0.24. Film thicknesses of the first and second optical guide layers 33, 35 at the optical output end are respectively 45 nm. In the gain region 30A, compressive stress of about 0.2% is applied to the first and second optical guide layers 33, 35.

Moreover, in the gain region 30A, a composition ratio x1 of $In_{x1}Ga_{1-x1}As_{y1}P_{1-y1}$, constituting the well layer 34*w* is 0.81 and a composition ratio y1 thereof is 0.61. A composition ratio x2 of $In_{x2}Ga_{1-x2}As_{y2}P_{1-y2}$ constituting the barrier layer 34*b* is 0.92 and a composition ratio y2 thereof is 0.33. In addition, in the gain region, respective one layer of the well layers 34*w* has a thickness of 6 nm, and respective one layer of the barrier layer 34*b* has a thickness of 15 nm. In such structure, compressive stress exists in the well layers 34*w* and the barrier layers 34*b*.

Since film thicknesses of respective regions may be changed by varying film thickness distribution of the gain region 30A and the waveguide region 30B by means of selective growth, respective composition ratios of the first and second optical guide layers 33, 35 and the MQW layer 34 have different values in the gain region 30A depending upon their film thicknesses.

Figure 25B:
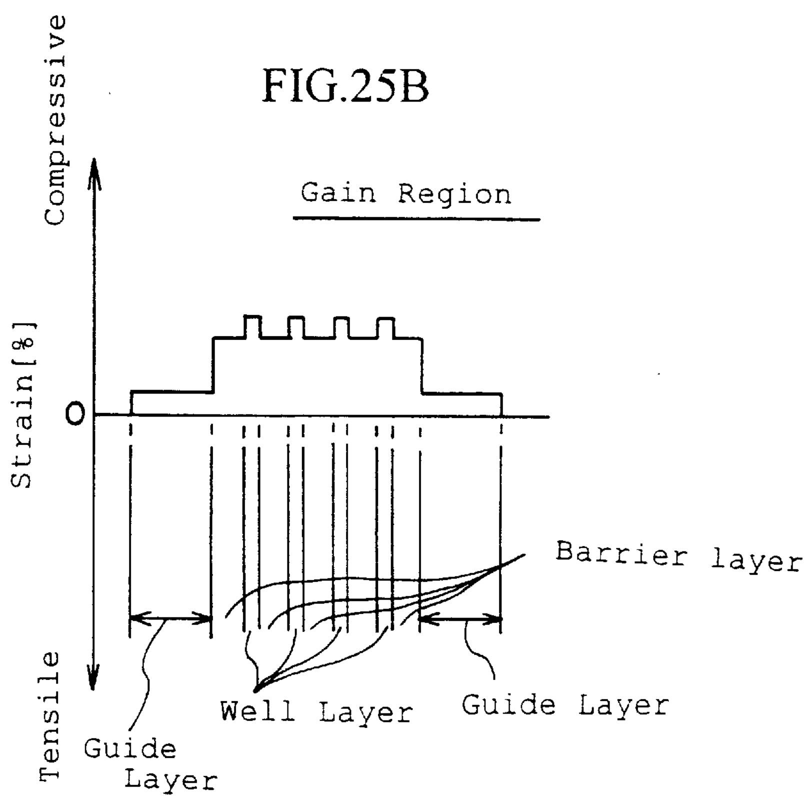
FIG. 25B is a view showing a stress distribution in a gain region of the optical semiconductor device in FIG. 25A.

Although, in the gain region 30A, stress generated in the MQW layer 34 and the first and second guide layers 33, 35 is shown in FIG. 25B, there is no possibility the MQW layer 34 is compressed excessively since compressive stress in the first and second optical guide layers 33, 35 is small.

Incidentally, a film thickness of the n-InP cladding layer 32 is 100 nm, and a film thickness of the p type InP cladding layer 36 is 200 nm.

As has been stated earlier, if tensile stress is caused in the first and second guide layers 33, 35 in the waveguide region 30B by adjusting the film thickness and the composition ratio of the compound semiconductor constituting the first and second guide layers 33, 35, an amount of compressive stress can be reduced in the first and second guide layers 33, 35 in the gain region 30A having thick film thickness.

This makes it possible to reduce an amount of compressive stress caused in overall layers in the gain region. Thus the MQW layer 34 is not subject to excessive compressive stress from the external. As a result, crystal dislocation is no longer generated in the MQW layer 34 even though the layer number of the well layers 34*w* is increased. This allows degradation in the characteristic of the semiconductor laser formed in the gain region 30A to be suppressed.

Figure 26:
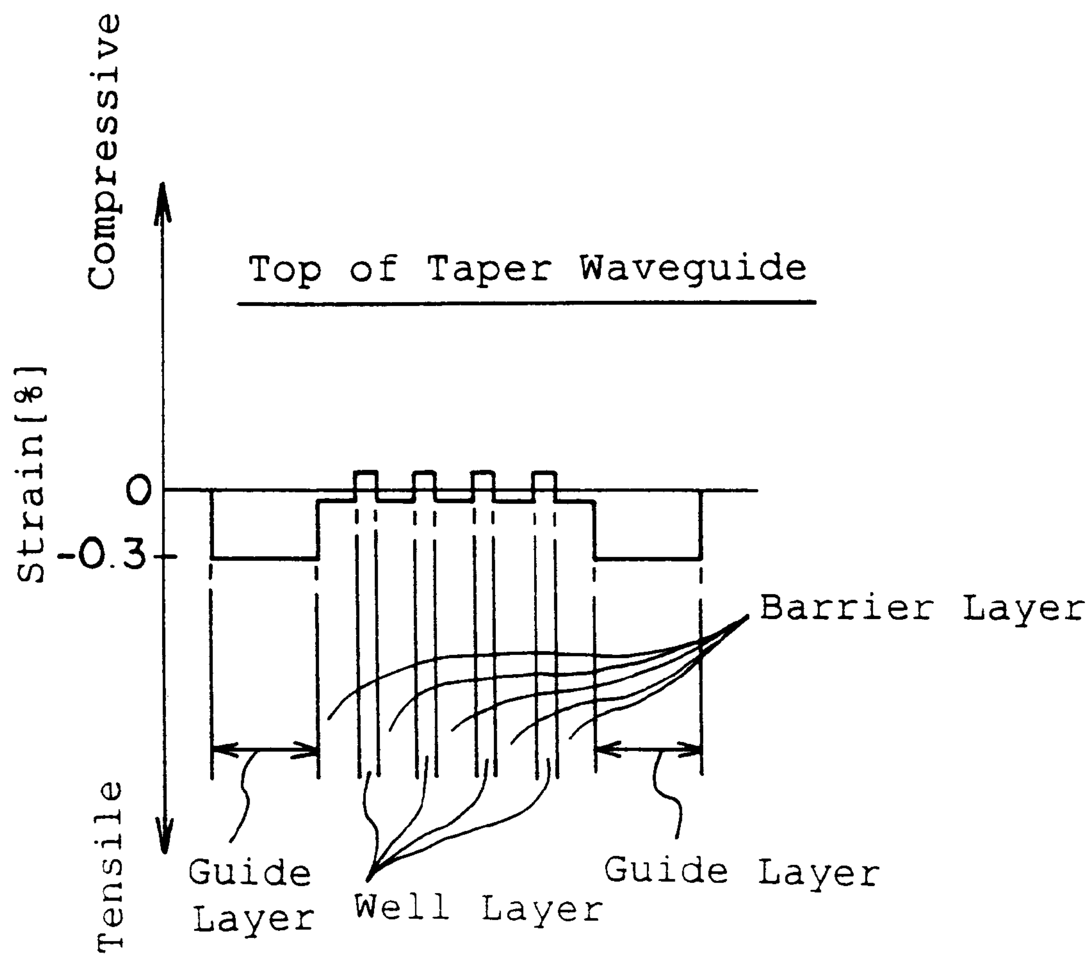
FIG. 26 is a view showing a stress distribution in a top portion of a taper waveguide of the optical semiconductor device according to a modification of the third embodiment of the present invention.

In any event, excessive strain in the gain region 30A can be prevented by adjusting stress in the well layer 34*w* and the barrier layer 34*b* in the waveguide region 30B. In such a case, for example, as shown in FIG. 26, tensile strain may be generated in the barrier layer 34*b* while compressive strain may be generated in the well layer 34*w*.

Though optical semiconductor laser having the above structure has been formed as a Fabry-Perot semiconductor laser, it may be formed as a DFB (distributed feedback) semiconductor laser wherein a uneven diffraction grating 32A is provided on the lower or upper optical guide layers 33, 35 in the gain region 30A as shown in FIG. 23A.

According to the third embodiment, since tensile strain is caused in the optical guide layers sandwiching the quantum well structure layers at the end portion of the waveguide region, a magnitude of compressive strain in the optical guide layer may be lowered in the gain region. Consequently, crystal dislocation may be prevented from being generated in the well layer, to which compressive strain is being applied, due to reduction in the overall compressive strain in the gain region.

What is claimed is:

1. An optical semiconductor device comprising:

a quantum well structure layer in which a gain region is formed evenly and a waveguide region is formed thinner than said gain region and in a taper fashion;

cladding layers formed over and below said quantum well structure layer; and optical guide layers formed between said cladding layers and said quantum well structure layer, in which gain regions are formed evenly and waveguide regions are formed thinner than said gain regions and in a taper fashion, and tensile stress is generated at tops of tapered regions.

2. An optical semiconductor device according to claim 1, wherein said quantum well structure layer comprises a multiple quantum well structure layer.

3. An optical semiconductor device according to claim 1, wherein compressive strain is generated in a well layer constituting said quantum well structure layer at a top of tapered region.

4. An optical semiconductor device according to claim 1, wherein tensile strain is generated in a barrier layer constituting said quantum well structure layer at a top of tapered region.

5. An optical semiconductor device according to claim 1, wherein said optical guide layers are formed of a mixed crystal including indium and gallium.

6. An optical semiconductor device according to claim 1, wherein reflection surface are formed on both ends of at least said quantum well structure layer and said optical guide layers.

7. An optical semiconductor device according to claim 1, wherein a diffraction grating is formed between an upper one of said optical guide layers and an upper one of said cladding layers or between a lower one of said optical guide layers and a lower one of said cladding layers.

* * * * *